(12) United States Patent
Kim et al.

(10) Patent No.: US 11,710,518 B2
(45) Date of Patent: Jul. 25, 2023

(54) SENSE AMPLIFIER HAVING OFFSET CANCELLATION

(71) Applicant: SAMSUNG ELECTRONICS CO., LTD., Suwon-si (KR)

(72) Inventors: Young-Wook Kim, Seoul (KR); Hyuk-Joon Kwon, Yongin-si (KR); Sang-Keun Han, Seongnam-si (KR); Bok-Yeon Won, Namyangju-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 242 days.

(21) Appl. No.: 17/321,769

(22) Filed: May 17, 2021

(65) Prior Publication Data

US 2021/0272618 A1 Sep. 2, 2021

Related U.S. Application Data

(63) Continuation of application No. 16/989,207, filed on Aug. 10, 2020, now Pat. No. 11,043,257, which is a
(Continued)

(30) Foreign Application Priority Data

Dec. 28, 2016 (KR) .................. 10-2016-0181446

(51) Int. Cl.
*G11C 5/06* (2006.01)
*G11C 11/4091* (2006.01)
(Continued)

(52) U.S. Cl.
CPC .......... *G11C 11/4091* (2013.01); *G11C 5/025* (2013.01); *G11C 7/02* (2013.01);
(Continued)

(58) Field of Classification Search
CPC . G11C 11/4091; G11C 7/06; G11C 2207/002; G11C 7/1048
See application file for complete search history.

(56) References Cited

U.S. PATENT DOCUMENTS 5,745,419 A 4/1998 Brauch
6,046,950 A 4/2000 Kim
(Continued)

FOREIGN PATENT DOCUMENTS

CN 1471107 A 1/2004
CN 1581356 A 2/2005
(Continued)

OTHER PUBLICATIONS

Chinese Office Action dated Oct. 29, 2020 Cited in Chinese Application No. 202010048328.6.
(Continued)

*Primary Examiner* — Uyen Smet
(74) *Attorney, Agent, or Firm* — Volentine, Whitt & Francos, PLLC

(57) ABSTRACT

A sense amplifier includes a sense amplifying unit, first and second isolation units, and first and second offset cancellation unit. The sense amplifying unit includes a first P-type metal-oxide-semiconductor (PMOS) transistor, a second PMOS transistor, a first N-type metal-oxide-semiconductor (NMOS) transistor, and a second NMOS transistor. In a layout of the sense amplifier, the first and second PMOS transistors are disposed in a central region of the sense amplifier, the first and second NMOS transistors are disposed at opposite sides of the sense amplifier from each other, the first isolation unit and the first offset cancellation unit are disposed between the first PMOS transistor and the first NMOS transistor, and the second isolation unit and the second offset cancellation unit are disposed between the second PMOS transistor and the second NMOS transistor. In
(Continued)

other layouts, the locations of the PMOS transistors and NMOS transistors may be reversed.

20 Claims, 31 Drawing Sheets

Related U.S. Application Data continuation of application No. 16/829,044, filed on Mar. 25, 2020, now Pat. No. 10,803,925, which is a continuation of application No. 16/707,738, filed on Dec. 9, 2019, now Pat. No. 10,692,565, which is a continuation of application No. 16/256,883, filed on Jan. 24, 2019, now Pat. No. 10,541,022, which is a continuation of application No. 15/697,164, filed on Sep. 6, 2017, now Pat. No. 10,224,093.

(51) Int. Cl.
*G11C 5/02* (2006.01)
*G11C 7/02* (2006.01)
*G11C 11/4094* (2006.01)
*G11C 11/4097* (2006.01)
*G11C 11/4096* (2006.01)
*G11C 11/408* (2006.01)
*G11C 7/06* (2006.01)

(52) U.S. Cl.
CPC ...... *G11C 11/4094* (2013.01); *G11C 11/4097* (2013.01); *G11C 5/02* (2013.01); *G11C 5/06* (2013.01); *G11C 7/06* (2013.01); *G11C 11/4082* (2013.01); *G11C 11/4087* (2013.01); *G11C 11/4096* (2013.01); *G11C 2207/002* (2013.01)

(56) References Cited

U.S. PATENT DOCUMENTS

| | | | |
|---|---|---|---|
| 6,584,026 B2 | 6/2003 | Kawasumi | |
| 6,819,600 B2 | 11/2004 | Sim | |
| 7,570,529 B2 | 8/2009 | Kim et al. | |
| 7,990,793 B2 | 8/2011 | Kajigaya | |
| 8,570,809 B2 | 10/2013 | Hirose et al. | |
| 8,575,697 B2 | 11/2013 | Mazure | |
| 8,957,459 B2 | 2/2015 | Morimoto et al. | |
| 9,202,531 B2 | 12/2015 | Seo | |
| 9,343,138 B2 | 5/2016 | Antonyan | |
| 10,074,408 B2 | 9/2018 | Seo | |
| 10,224,093 B2 | 3/2019 | Kim et al. | |
| 10,803,925 B2 | 10/2020 | Kim et al. | |
| 2002/0190279 A1 | 12/2002 | Nakatsuka | |
| 2004/0027892 A1 | 2/2004 | Sim | |
| 2005/0213407 A1 | 9/2005 | Myoung Rho | |
| 2006/0023535 A1 | 2/2006 | Chun et al. | |
| 2006/0092738 A1 | 5/2006 | Kang et al. | |
| 2009/0003105 A1 | 1/2009 | Itoh et al. | |
| 2009/0066314 A1 | 3/2009 | Lee | |
| 2011/0051532 A1 | 3/2011 | Barth, Jr. et al. | |
| 2013/0258793 A1 | 10/2013 | Takayama et al. | |
| 2014/0085997 A1 | 3/2014 | Kajigaya | |
| 2014/0233336 A1 | 8/2014 | Shin et al. | |
| 2015/0036444 A1* | 2/2015 | Seo | G11C 11/4091 365/210.1 |
| 2018/0061461 A1 | 3/2018 | Seo | |
| 2018/0061469 A1 | 3/2018 | Derner et al. | |

FOREIGN PATENT DOCUMENTS

| | | |
|---|---|---|
| CN | 1604463 A | 4/2005 |
| CN | 101241749 A | 8/2008 |
| CN | 101540188 A | 9/2009 |
| CN | 102903719 A | 1/2013 |
| CN | 104715781 A | 6/2015 |
| CN | 105761751 A | 7/2016 |
| JP | 2014026716 A | 2/2014 |
| KR | 10-2008-0010654 A | 1/2008 |
| KR | 1020080069042 | 7/2008 |

OTHER PUBLICATIONS

Chinese Office Action dated Aug. 25, 2020 in Related Chinese Application No. CN 201911156606.3.
Chinese Office Action dated Sep. 7, 2020 in Related Chinese Application No. CN 201911214606.4.

* cited by examiner

[ Precharging Operation ]

[ Restoring Operation ]

SENSE AMPLIFIER HAVING OFFSET CANCELLATION

CROSS-REFERENCE TO RELATED APPLICATION

This is a Continuation of U.S. application Ser. No. 16/989,207, filed Aug. 10, 2020, which is a Continuation of U.S. application Ser. No. 16/829,044, filed Mar. 25, 2020, now U.S. Pat. No. 10,803,925, issued Oct. 13, 2021, which is a Continuation of U.S. application Ser. No. 16/707,738, filed Dec. 9, 2019, now U.S. Pat. No. 10,692,565, issued Jun. 23, 2020, which is a Continuation of U.S. application Ser. No. 16/256,883, filed Jan. 24, 2019, now U.S. Pat. No. 10,541,022, issued Jan. 21, 2020, which is a Continuation of U.S. application Ser. No. 15/697,164, filed Sep. 6, 2017, now U.S. Pat. No. 10,224,093, issued Mar. 5, 2019, and a claim of priority is made to Korean Patent Application No. 10-2016-0181446, filed on Dec. 28, 2016, in the Korean Intellectual Property Office, the disclosure of which is incorporated herein in its entirety by reference.

BACKGROUND

The inventive concept relates to a semiconductor memory device, and more particularly, to a sense amplifier for improving an effective sensing margin based on an operation of cancelling an offset of the sense amplifier.

A dynamic random-access memory (DRAM) among memory devices operates in a manner in which data is written by electric charges stored in cell capacitors of memory cells. Memory cells are connected to a bit line (BL) and a complementary bit line (BLB). In a DRAM, when a read operation or a refresh operation is performed, a sense amplifier senses and amplifies a voltage difference between the bit line and the complementary bit line. Semiconductor devices constituting the sense amplifier may have different device characteristics, for example, different threshold voltages, due to a process variation, temperature, or the like. Such different device characteristics may cause offset noise in the sense amplifier. Due to the offset noise, an effective sensing margin of the sense amplifier may be reduced, and performance of the DRAM may be reduced.

SUMMARY

The inventive concept provides a sense amplifier which may improve an effective sensing margin based on an operation of cancelling an offset of the sense amplifier, and a layout method thereof.

According to an aspect of the inventive concept, there is provided a sense amplifier which senses a voltage variation of a bit line. The sense amplifier includes a sense amplifying unit connected to the bit line and a complementary bit line, configured to sense a voltage variation of the bit line in response to a first control signal and a second control signal, and configured to adjust voltages of a sensing bit line and a complementary sensing bit line based on the sensed voltage variation, a first isolation unit configured to connect the bit line to the sensing bit line in response to an isolation signal, a second isolation unit configured to connect the complementary bit line to the complementary sensing bit line in response to the isolation signal, a first offset cancellation unit configured to connect the bit line to the complementary sensing bit line in response to an offset cancellation signal, and a second offset cancellation unit configured to connect the complementary bit line to the sensing bit line in response to the offset cancellation signal. The sense amplifying unit includes a first P-type metal-oxide-semiconductor (PMOS) transistor connected between the first control signal and the complementary sensing bit line and having a gate connected to the sensing bit line, a second PMOS transistor connected between the first control signal and the sensing bit line and having a gate connected to the complementary sensing bit line, a first N-type metal-oxide-semiconductor (NMOS) transistor connected between the second control signal and the complementary sensing bit line and having a gate connected to the bit line, and a second NMOS transistor connected between the second control signal and the sensing bit line and having a gate connected to the complementary bit line In the sense amplifier according to embodiments of the inventive concept, the first and second PMOS transistors are disposed in a central region of the sense amplifier, the first and second NMOS transistors are respectively disposed at both edges of the sense amplifier, the first isolation unit and the first offset cancellation unit are disposed between the first PMOS transistor and the first NMOS transistor, and the second isolation unit and the second offset cancellation unit are disposed between the second PMOS transistor and the second NMOS transistor.

In the sense amplifier according to embodiments of the inventive concept, the first and second NMOS transistors are disposed in a central region of the sense amplifier, the first and second PMOS transistors are respectively disposed at both edges of the sense amplifier, the first isolation unit and the first offset cancellation unit are disposed between the first NMOS transistor and the first PMOS transistor, and the second isolation unit and the second offset cancellation unit are disposed between the second NMOS transistor and the second PMOS transistor.

According to another aspect of the inventive concept, a device comprises: an isolation transistor configured to connect a bit line to a sensing bit line in response to an isolation signal; an offset cancellation transistor configured to connect the bit line to a complementary sensing bit line in response to an offset cancellation signal; and a sense amplifying unit configured to sense a bit line voltage of the bit line, the sense amplifying unit including a P-type metal oxide semiconductor (PMOS) transistor and an N-type metal oxide semiconductor (NMOS) transistor. The isolation transistor and the offset cancellation transistor are disposed between the PMOS transistor and the NMOS transistor.

According to yet another aspect of the inventive concept, a sense amplifier comprises: a first isolation unit configured to connect a bit line to a sensing bit line in response to an isolation signal; a second isolation unit configured to connect a complementary bit line to a complementary sensing bit line in response to the isolation signal; a first offset cancellation unit configured to connect the bit line to the complementary sensing bit line in response to an offset cancellation signal; a second offset cancellation unit configured to connect the complementary bit line to the sensing bit line in response to the offset cancellation signal; a pair of P-type metal oxide semiconductor (PMOS) transistors, including, a first PMOS transistor connected between a first control line and the complementary sensing bit line, and having a control terminal connected to the sensing bit line, and a second PMOS transistor connected between the first control line and the sensing bit line, and having a control terminal connected to the complementary sensing bit line; and a pair of N-type metal oxide semiconductor (NMOS) transistors, including, a first NMOS transistor connected between a second control line and the complementary sensing bit line, and having a control terminal connected to the sensing bit line, and a second NMOS transistor connected between the second control line and the sensing bit line, and having a control terminal connected to the complementary sensing bit line. First transistors of a first pair selected from the pair of PMOS transistors and the pair NMOS transistors are disposed at opposite sides of the sense amplifier from each other, and second transistors of a second pair selected from the pair of PMOS transistors and the pair NMOS transistors are disposed in a central region of the sense amplifier between the first transistors. The first isolation unit and the first offset cancellation unit are disposed between the first PMOS transistor and the first NMOS transistor. The second isolation unit and the second offset cancellation unit are disposed between the second PMOS transistor and the second NMOS transistor.

According to still another aspect of the inventive concept, a memory device comprises: a first memory cell array having a bit line; a second memory cell array having a complementary bit line; and a sense amplifier for sensing a bit line voltage of the bit line. The sense amplifier comprises: a first isolation unit configured to connect the bit line to a sensing bit line in response to an isolation signal; a second isolation unit configured to connect the complementary bit line to a complementary sensing bit line in response to the isolation signal; a first offset cancellation unit configured to connect the bit line to the complementary sensing bit line in response to an offset cancellation signal; a second offset cancellation unit configured to connect the complementary bit line to the sensing bit line in response to the offset cancellation signal; a pair of P-type metal oxide semiconductor (PMOS) transistors, including, a first PMOS transistor connected between a first control line and the complementary sensing bit line, and having a control terminal connected to the sensing bit line, and a second PMOS transistor connected between the first control line and the sensing bit line, and having a control terminal connected to the complementary sensing bit line; and a pair of N-type metal oxide semiconductor (NMOS) transistors, including, a first NMOS transistor connected between a second control line and the complementary sensing bit line, and having a control terminal connected to the sensing bit line, and a second NMOS transistor connected between the second control line and the sensing bit line, and having a control terminal connected to the complementary sensing bit line. Transistors of a first pair selected from the pair of PMOS transistors and the pair NMOS transistors are disposed at opposite sides of the sense amplifier from each other, and transistors of a second pair selected from the pair of PMOS transistors and the pair NMOS transistors are disposed in a central region of the sense amplifier between the transistors of the first pair. The first isolation unit and the first offset cancellation unit are disposed between the first PMOS transistor and the first NMOS transistor. The second isolation unit and the second offset cancellation unit are disposed between the second PMOS transistor and the second NMOS transistor.

According to a further aspect of the inventive concept, a sense amplifier comprises: a first isolation unit configured to connect a bit line to a sensing bit line in response to an isolation signal; a second isolation unit configured to connect a complementary bit line to a complementary sensing bit line in response to the isolation signal; a first offset cancellation unit configured to connect the bit line to the complementary sensing bit line in response to an offset cancellation signal; a second offset cancellation unit configured to connect the complementary bit line to the sensing bit line in response to the offset cancellation signal; a first P-type metal oxide semiconductor (PMOS) transistor connected between a first control line and the complementary sensing bit line and having a control terminal connected to the sensing bit line; a second PMOS transistor connected between the first control line and the sensing bit line and having a control terminal connected to the complementary sensing bit line; a first N-type metal oxide semiconductor (NMOS) transistor connected between a second control line and the complementary sensing bit line and having a control terminal connected to the sensing bit line; and a second NMOS transistor connected between the second control line and the sensing bit line and having a control terminal connected to the complementary sensing bit line. The first isolation unit and the first offset cancellation unit are disposed between the first PMOS transistor and the first NMOS transistor. The second isolation unit and the second offset cancellation unit are disposed between the second PMOS transistor and the second NMOS transistor. Either: the NMOS transistors are disposed at opposite sides of the sense amplifier from each other, and the PMOS transistors are disposed in a central region of the sense amplifier between the NMOS transistors, or the PMOS transistors are disposed at the opposite sides of the sense amplifier from each other, and the NMOS transistors are disposed in the central region of the sense amplifier between the PMOS transistors.

According to a yet further aspect of the inventive concept, a sense amplifier comprises: a first isolation unit configured to selectively connect a bit line to a sensing bit line; a second isolation unit configured to selectively connect a complementary bit line to a complementary sensing bit line; a first offset cancellation unit configured to selectively connect the bit line to the complementary sensing bit line; a second offset cancellation unit configured to selectively connect the complementary bit line to the sensing bit line; a first P-type metal oxide semiconductor (PMOS) transistor configured to selectively connect a first control line and the complementary sensing bit; a second PMOS transistor configured to selectively connect the first control line and the sensing bit line; a first N-type metal oxide semiconductor (NMOS) configured to selectively connect a second control line and the complementary sensing bit line; and a second NMOS transistor configured to selectively connect the second control line and the sensing bit line. The first isolation unit and the first offset cancellation unit are disposed between the first PMOS transistor and the first NMOS transistor. The second isolation unit and the second offset cancellation unit are disposed between the second PMOS transistor and the second NMOS transistor. Either: the NMOS transistors are disposed at opposite sides of the sense amplifier from each other, and the PMOS transistors are disposed in a central region of the sense amplifier between the NMOS transistors, or the PMOS transistors are disposed at the opposite sides of the sense amplifier from each other, and the NMOS transistors are disposed in the central region of the sense amplifier between the PMOS transistors.

According to a still further aspect of the inventive concept, a sense amplifier comprises: a first isolation unit; a second isolation unit; a first offset cancellation unit; a second offset cancellation unit; a pair of P-type metal oxide semiconductor (PMOS) transistors including a first PMOS transistor and a second PMOS transistor; and a pair of N-type metal oxide semiconductor (NMOS) transistors including a first NMOS transistor and a second NMOS transistor. Transistors of a first pair selected from the pair of PMOS transistors and the pair NMOS transistors are disposed at opposite sides of the sense amplifier from each other, and transistors of a second pair selected from the pair of PMOS transistors and the pair NMOS transistors are disposed in a central region of the sense amplifier between the transistors of the first pair. The first isolation unit and the first offset cancellation unit are disposed between the first PMOS transistor and the first NMOS transistor. The second isolation unit and the second offset cancellation unit are disposed between the second PMOS transistor and the second NMOS transistor.

BRIEF DESCRIPTION OF THE DRAWINGS

Embodiments of the inventive concept will be more clearly understood from the following detailed description taken in conjunction with the accompanying drawings.

DETAILED DESCRIPTION OF THE EMBODIMENTS

Hereinafter, embodiments of the inventive concept will be described with reference to the accompanying drawings. However, it will be understood by those skilled in the art that the inventive concept may be performed in other concrete forms without changing the technological scope and essential features. Therefore, embodiments described below should be considered in a descriptive sense only and not for purposes of limitation.

As is traditional in the field of the inventive concepts, one or more elements of embodiments may be described and illustrated in terms of functional blocks, units and/or modules. These blocks, units and/or modules are physically implemented by electronic circuits such as logic circuits, microprocessors, hard-wired circuits or the like, and may optionally be driven by firmware and/or software. Also, each functional block, unit and/or module of the embodiments may be physically separated into two or more interacting and discrete blocks, units and/or modules without departing from the scope of the inventive concepts. Further, two or more of the functional blocks, units and/or modules of the embodiments may be physically combined into more complex blocks or units without departing from the scope of the inventive concepts.

Figure 1:
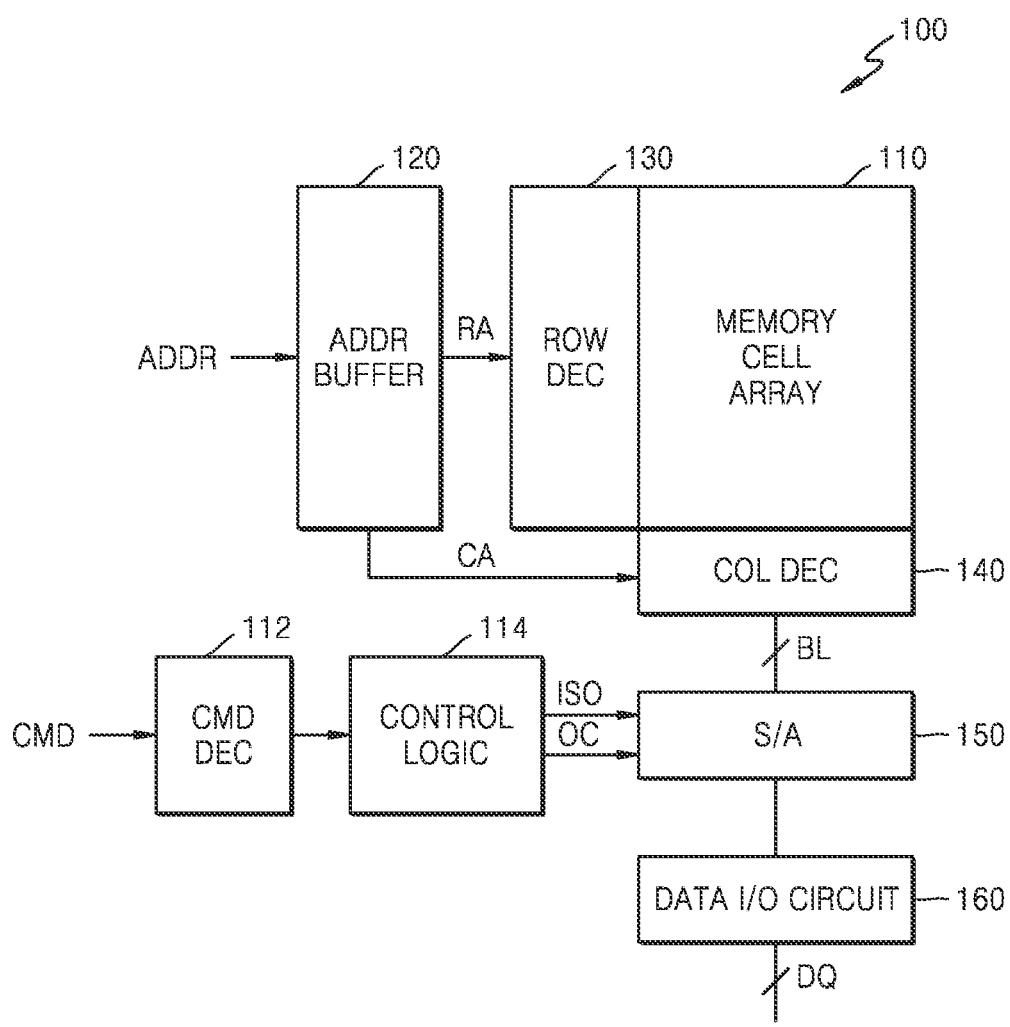
FIG. 1 is a block diagram for describing an embodiment of a memory device.

FIG. 1 is a block diagram for describing an embodiment of a memory device.

Referring to FIG. 1, a memory device 100 may be a storage unit or device based on semiconductor devices or components. For example, memory device 100 may be a volatile memory such as a dynamic random-access memory (DRAM), a synchronous dynamic random-access memory (SDRAM), a double data rate synchronous dynamic random-access memory (DDR SDRAM), a low power double data rate synchronous dynamic random-access memory (LPDDR SDRAM), a graphics double data rate synchronous dynamic random-access memory (GDDR SDRAM), a double data rate type two synchronous dynamic random-access memory (DDR2 SDRAM), a double data rate type three synchronous dynamic random-access memory (DDR3 SDRAM), a double data rate fourth-generation synchronous dynamic random-access memory (DDR4 SDRAM), a thyristor random-access memory (TRAM), or the like, or a non-volatile memory such as a phase-change random-access memory (PRAM), a magnetic random-access memory (MRAM), a resistive random-access memory (RRAM), or the like.

Memory device 100 may output data through data lines DQ in response to commands CMD, addresses ADDR, and control signals, which are received from an external device, for example, a memory controller. Memory device 100 includes a memory cell array 110, a command decoder 112, a control logic 114, an address buffer 120, a row decoder 130, a column decoder 140, a sense amplifier 150, and a data input-and-output circuit 160.

Memory cell array 110 includes a plurality of memory cells which are provided in a matrix form arranged in rows and columns. Memory cell array 110 includes a plurality of word lines and a plurality of bit lines BL, which are connected to the memory cells. The plurality of word lines may be connected to rows of the memory cells and the plurality of bit lines BL may be connected to columns of the memory cells.

Command decoder 112 may decode a write enable signal/WE, a row address strobe signal/RAS, a column address strobe signal/CAS, a chip select signal/CS, and the like, which are received from the external device, for example, the memory controller, and may allow control logic 114 to generate control signals corresponding to commands CMD. The commands CMD may include an activate command, a read command, a write command, a precharge command, and the like.

Address buffer 120 receives addresses ADDR from the memory controller, which is an external device. The addresses ADDR include a row address RA which addresses a row of memory cell array 110 and a column address CA which addresses a column of memory cell array 110. Address buffer 120 may transmit the row address RA to row decoder 130 and the column address CA to column decoder 140.

Row decoder 130 may select any one of the plurality of word lines connected to memory cell array 110. Row decoder 130 may decode the row address RA received from address buffer 120, select any one word line corresponding to the row address RA, and activate the selected word line.

Column decoder 140 may select a predetermined number of bit lines from the plurality of bit lines BL of memory cell array 110. Column decoder 140 may decode the column address CA received from address buffer 120 and select a predetermined number of bit lines BL corresponding to the received column address CA.

Sense amplifier 150 is connected to the bit lines BL of memory cell array 110. Sense amplifier 150 may sense a variation of voltages of the selected bit lines among the plurality of bit lines BL, amplify the voltage variations, and output the amplified voltage variations. Data input-and-output circuit 160 may output data, based on the voltages sensed and amplified by sense amplifier 150, through the data lines DQ.

Sense amplifier 150 may receive an isolation signal ISO and an offset cancellation signal OC from control logic 114. Sense amplifier 150 may perform an offset cancelling operation in response to the isolation signal ISO and the offset cancellation signal OC. For example, an offset indicates a characteristic difference between semiconductor devices constituting sense amplifier 150, for example, a difference between threshold voltages of different semiconductor devices.

Hereinafter, a configuration and operations of sense amplifier 150 will be described in detail with reference to various embodiments.

Figure 2A:
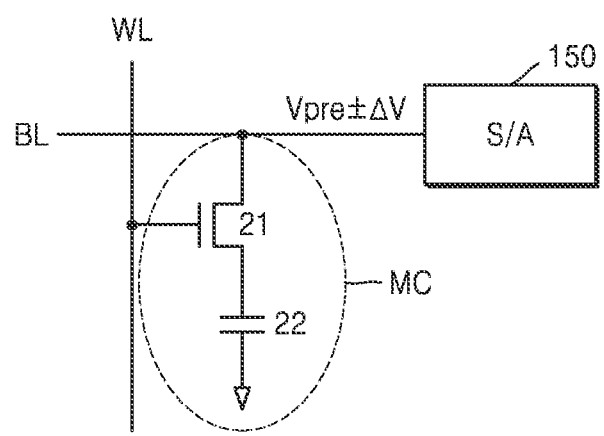
FIGS. 2A and 2B are diagrams for describing a bit line voltage sensing operation of a sense amplifier of FIG. 1.
Figure 2B:
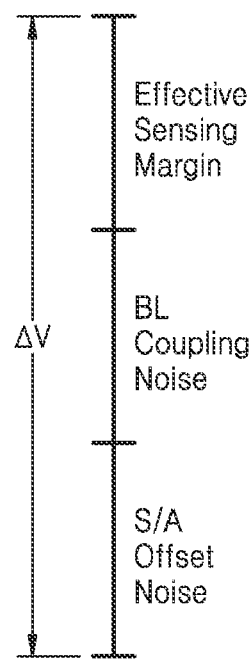

FIGS. 2A and 2B are diagrams for describing a bit line voltage sensing operation of the sense amplifier of FIG. 1.

Referring to FIGS. 1 and 2A, a memory cell MC included in memory cell array 110 includes a cell transistor 21 and a cell capacitor 22. Memory device 100 may perform a read operation or a refresh operation based on an amount of electric charge stored in the cell capacitor 22 included in the memory cell MC. In this case, a bit line BL connected to the memory cell MC is precharged to a precharge voltage Vpre. Then, as the word line WL is activated, a charge sharing operation is performed between electric charges of the bit line BL charged to the precharge voltage Vpre and electric charges of cell capacitor 22 of the memory cell MC. Due to the charge sharing operation, a voltage of the bit line BL may be decreased or increased from the precharge voltage Vpre by an amount of a voltage variation (ΔV).

Sense amplifier 150 may sense the amount of voltage variation (ΔV) and amplify the amount thereof. In this case, due to a bit line coupling noise, a sense amplifier offset noise, and the like, an effective sensing margin of sense amplifier 150 may be represented as illustrated in FIG. 2B. When the amount of voltage variation (ΔV) is less than or equal to a predetermined level, sense amplifier 150 may not sense the amount of voltage variation (ΔV) of the bit line BL. That is, the sense amplifier offset noise may be a factor that reduces the effective sensing margin of sense amplifier 150.

Figure 3:
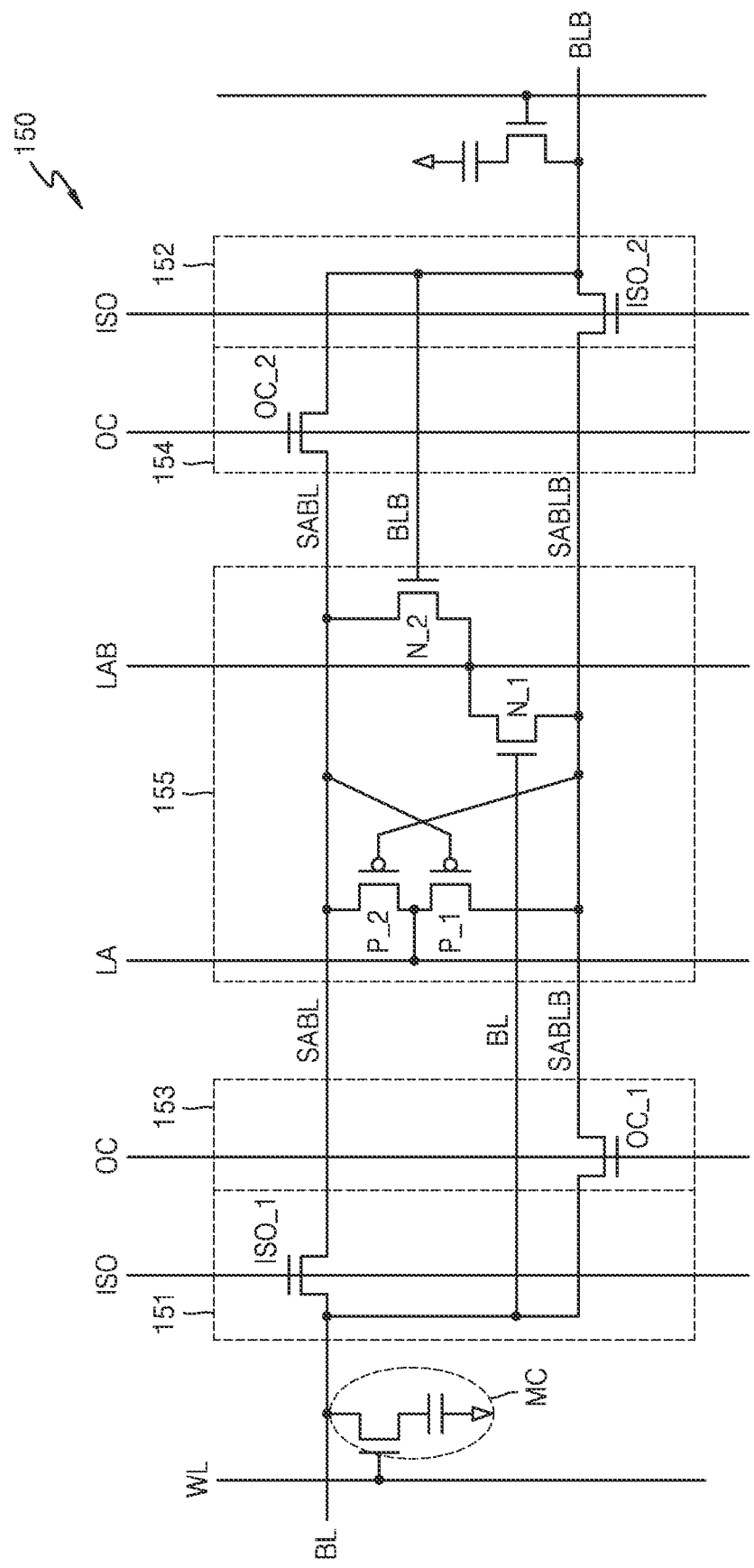
FIG. 3 is a circuit diagram for describing an embodiment of a sense amplifier.

FIG. 3 is a circuit diagram for describing an embodiment of a sense amplifier.

Referring to FIG. 3, a sense amplifier 150 includes first and second isolation units 151 and 152, first and second offset cancellation units 153 and 154, and a sense amplifying unit 155.

First isolation unit 151 is connected between a bit line BL and a sensing bit line SABL and second isolation unit 152 is connected between a complementary bit line BLB and a complementary sensing bit line SABLB. First and second isolation units 151 and 152 receive isolation signals ISO and operate in response to the isolation signals ISO.

First isolation unit 151 may include a first isolation transistor ISO_1 which connects the bit line BL and the sensing bit line SABL, or isolates the bit line BL from the sensing bit line SABL, in response to the isolation signal ISO. One terminal of the first isolation transistor ISO_1 is connected to the bit line BL, the other terminal thereof is connected to the sensing bit line SABL, and a gate thereof is connected to the isolation signal ISO.

Second isolation unit 152 may include a second isolation transistor ISO_2 which connects the complementary bit line BLB and the complementary sensing bit line SABLB, or isolates the complementary bit line BLB from the complementary sensing bit line SABLB, in response to the isolation signal ISO. One terminal of the second isolation transistor ISO_2 is connected to the complementary bit line BLB, the other terminal thereof is connected to the complementary sensing bit line SABLB, and a gate thereof is connected to the isolation signal ISO.

First offset cancellation unit 153 is connected between the bit line BL and the complementary sensing bit line SABLB, and second offset cancellation unit 154 is connected between the complementary bit line BLB and the sensing bit line SABL. First and second offset cancellation units 153 and 154 receive offset cancellation signals OC and operate in response to the offset cancellation signals OC.

First offset cancellation unit 153 may include a first offset cancellation transistor OC_1 which connects the bit line BL and the complementary sensing bit line SABLB, or disconnects the bit line BL from the complementary sensing bit line SABLB, in response to the offset cancellation signal OC. One terminal of the first offset cancellation transistor OC_1 is connected to the bit line BL, the other terminal thereof is connected to the complementary sensing bit line SABLB, and a gate thereof is connected to the offset cancellation signal OC.

Second offset cancellation unit 154 may include a second offset cancellation transistor OC_2 which connects the complementary bit line BLB and the sensing bit line SABL, or disconnects the complementary bit line BLB from the sensing bit line SABL, in response to the offset cancellation signal OC. One terminal of the second offset cancellation transistor OC_2 is connected to the complementary bit line BLB, the other terminal thereof is connected to the sensing bit line SABL, and a gate thereof is connected to the offset cancellation signal OC.

Sense amplifying unit 155 may be connected between the sensing bit line SABL and the complementary sensing bit line SABLB, and may sense and amplify a voltage difference between the bit line BL and the complementary bit line BLB in response to first and second control signals LA and LAB. Sense amplifying unit 155 includes a pair of P-type metal-oxide-semiconductor (PMOS) transistors, first and second PMOS transistors P_1 and P_2, and a pair of N-type metal-oxide-semiconductor (NMOS) transistors, first and second NMOS transistors N_1 and N_2.

One terminal of the first PMOS transistor P_1 is connected to the complementary sensing bit line SABLB, the other terminal thereof is connected to a line of the first control signal LA, and a gate thereof is connected to the sensing bit line SABL. One terminal of the second PMOS transistor P_2 is connected to the sensing bit line SABL, the other terminal thereof is connected to the line of the first control signal LA, and a gate thereof is connected to the complementary sensing bit line SABLB.

One terminal of the first NMOS transistor N_1 is connected to the complementary sensing bit line SABLB, the other terminal thereof is connected to a line of the second control signal LAB, and a gate thereof is connected to the bit line BL. One terminal of the second NMOS transistor N_2 is connected to the sensing bit line SABL, the other terminal thereof is connected to the line of the second control signal LAB, and a gate thereof is connected to the complementary bit line BLB.

The bit line BL is connected to one terminal of cell transistor 21 (see FIG. 2A) included in the memory cell MC. The word line WL is connected to a gate of cell transistor 21.

FIGS. 4 to 7 are circuit diagrams and a flowchart for describing operations of the sense amplifier illustrated in FIG. 3.

Figure 4:
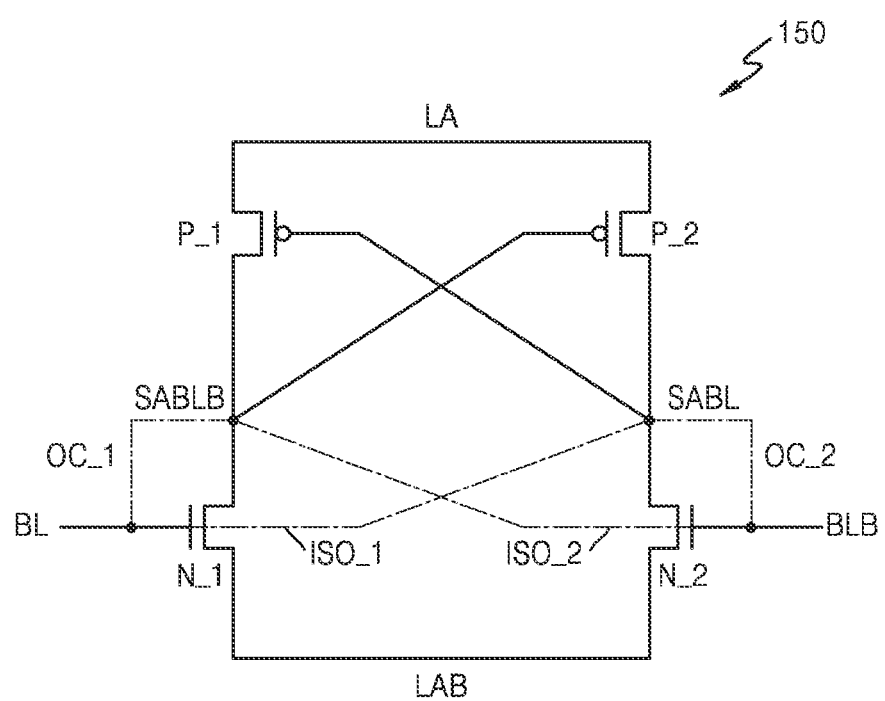
FIGS. 4, 5, 6A, 6B, 6C, 6D, 6E and 7 are circuit diagrams and a flowchart for describing operations of the sense amplifier illustrated in FIG. 3.

FIG. 4 shows an equivalent circuit of sense amplifier 150 of FIG. 3. For simplicity of the drawings, first and second isolation transistors ISO_1 and ISO_2 and first and second offset cancellation transistors OC_1 and OC_2 are illustrated using dashed lines. Operations of the equivalent circuit of sense amplifier 150 illustrated in FIG. 4 will be described in detail with reference to FIGS. 5 and 6A to 6E.

Figure 5:
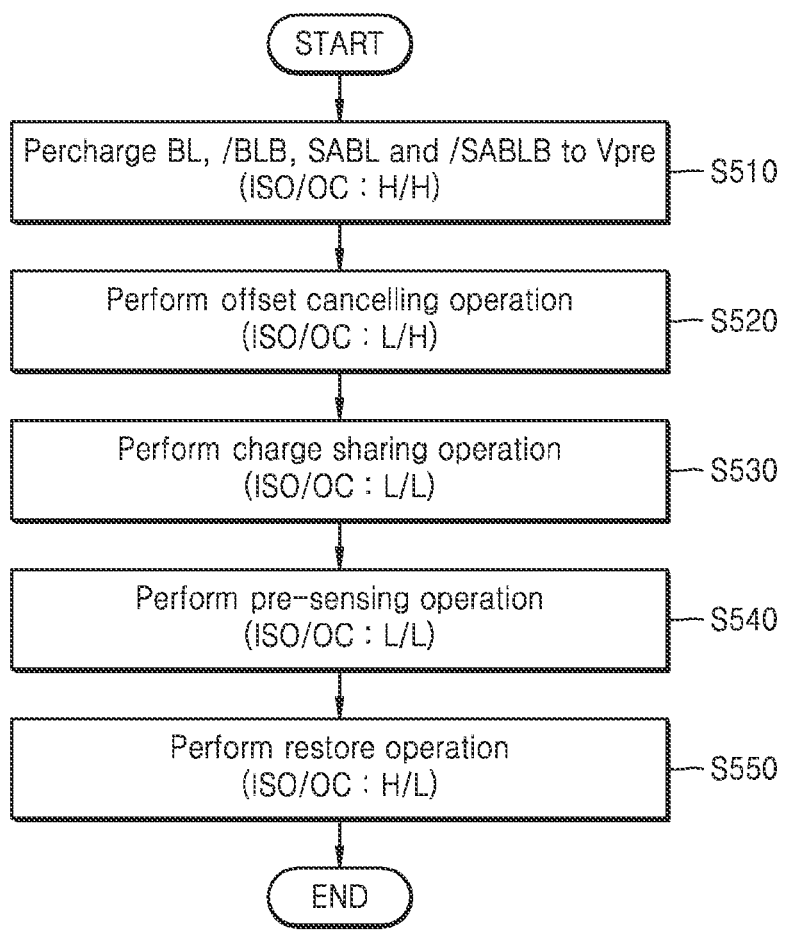

Referring to FIG. 5, sense amplifier 150 of FIG. 4 may sequentially perform a pre-charging operation (S510), an offset cancelling operation (S520), a charge sharing operation (S530), a pre-sensing operation (S540), and a restoring operation (S550) in response to isolation signals ISO, offset cancellation signals OC, and first and second control signals LA and LAB. For convenience of description, the operations of FIG. 5 will be described with reference to FIGS. 6A to 6E.

Figure 6A:
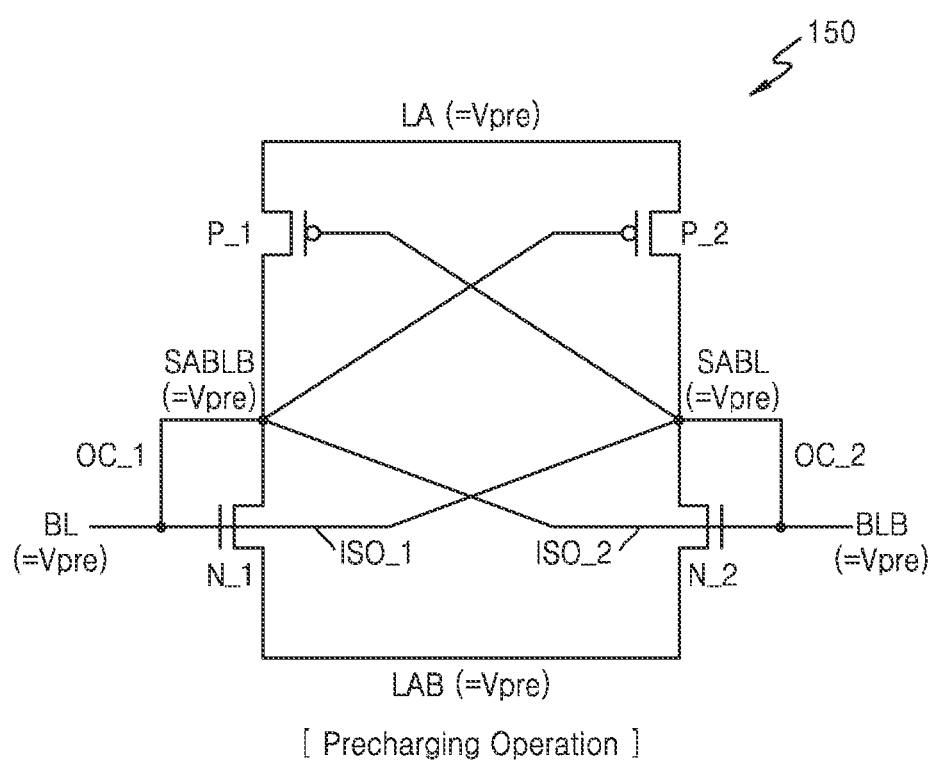

Referring to FIG. 6A, in operation S510 of FIG. 5, sense amplifier 150 performs a pre-charging operation. Sense amplifier 150 precharges a bit line BL, a complementary bit line BLB, a sensing bit line SABL, and a complementary sensing bit line SABLB to a precharge voltage Vpre. For example, the isolation signals ISO and the offset cancellation signals OC may be logic high (H).

The first and second isolation transistors ISO_1 and ISO_2 and the first and second offset cancellation transistors OC_1 and OC_2 are turned on in response to the isolation signals ISO and the offset cancellation signals OC of logic high (H). Accordingly, the bit line BL, the complementary bit line BLB, the sensing bit line SABL, and the complementary sensing bit line SABLB may be connected to one node and charged to the precharge voltage Vpre. In this case, the first and second control signals LA and LAB may be charged to the precharge voltage Vpre.

Figure 6B:
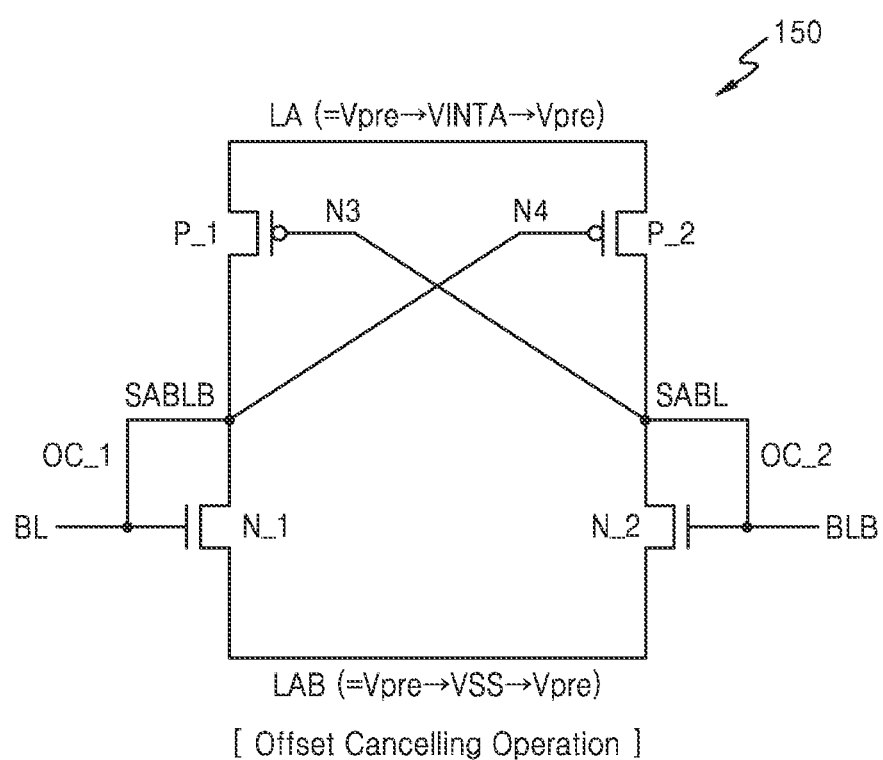

Referring to FIG. 6B, in operation S520 of FIG. 5, sense amplifier 150 performs an offset cancelling operation. For example, the isolation signals ISO may be logic low (L) and the offset cancellation signals OC may be logic high (H).

The first and second isolation transistors ISO_1 and ISO_2 are turned off in response to the isolation signals ISO of logic low (L), and the first and second offset cancellation transistors OC_1 and OC_2 are turned on in response to the offset cancellation signals OC of logic high (H). In this case, the first control signal LA is transitioned from the precharge voltage Vpre to an internal supply voltage VINTA and the second control signal LAB is transitioned from the precharge voltage Vpre to a ground voltage VSS. The internal supply voltage VINTA may be a voltage supplied to memory cell array 110 (see FIG. 1). Then, the first control signal LA is transitioned from the internal supply voltage VINTA to the precharge voltage Vpre and the second control signal LAB is transitioned from the ground voltage VSS to the precharge voltage Vpre.

In sense amplifier 150, for example, the first and second PMOS transistors P_1 and P_2 and the first and second NMOS transistors N_1 and N_2 may have different threshold voltages Vth than each other due to a variation in manufacturing processes, temperature, or the like. In this case, sense amplifier 150 may cause offset noise due to the difference between the threshold voltages Vth of the first and second PMOS transistors P_1 and P_2, and the first and second NMOS transistors N_1 and N_2. Hereinafter, a method of compensating an offset of sense amplifier 150 through an offset cancelling operation will be described with reference to first to fourth examples.

Figure 7:
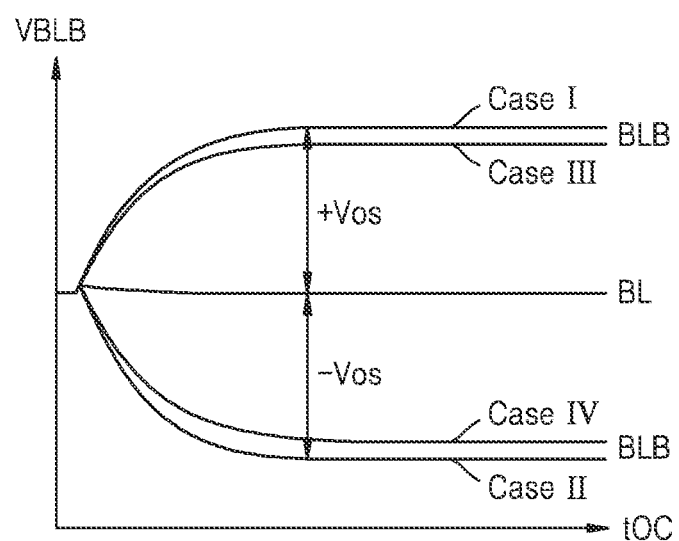

In a first example (Case I), it is assumed that the threshold voltage Vth of the first NMOS transistor N_1 is greater than the threshold voltage Vth of the second NMOS transistor N_2. The first and second NMOS transistors N_1 and N_2 operate as diodes. An amount of current which flows through the first NMOS transistor N_1 may be less than an amount of current which flows through the second NMOS transistor N_2. Also, an amount of current which flows through the first PMOS transistor P_1 may be less than an amount of current which flows through the second PMOS transistor P_2. Accordingly, as illustrated in FIG. 7, the voltage on the complementary bit line BLB may be increased to a predetermined level which is greater than the voltage on the bit line BL.

In a second example (Case II), it is assumed that the threshold voltage Vth of the second NMOS transistor N_2 is greater than the threshold voltage Vth of the first NMOS transistor N_1. The first and second NMOS transistors N_1 and N_2 operate as diodes. An amount of current which flows through the second NMOS transistor N_2 may be less than an amount of current which flows through the first NMOS transistor N_1. Also, an amount of current which flows through the second PMOS transistor P_2 may be less than an amount of current which flows through the first PMOS transistor P_1. Accordingly, as illustrated in FIG. 7, the voltage on the complementary bit line BLB may be reduced to a predetermined level which is less than the voltage on the bit line BL.

In a third example (Case III), it is assumed that the threshold voltage Vth of the first PMOS transistor P_1 is greater than the threshold voltage Vth of the second PMOS transistor P_2. An amount of current which flows through the first PMOS transistor P_1 may be less than an amount of current which flows through the second PMOS transistor P_2. The first and second NMOS transistors N_1 and N_2 may flow a predetermined amount of current as diodes. Accordingly, as illustrated in FIG. 7, the voltage on the complementary bit line BLB may be increased to a predetermined level which is greater than the voltage on the bit line BL.

In a fourth example (Case IV), it is assumed that the threshold voltage Vth of the second PMOS transistor P_2 is greater than the threshold voltage Vth of the first PMOS transistor P_1. An amount of current which flows through the second PMOS transistor P_2 may be less than an amount of current which flows through the first PMOS transistor P_1. The first and second NMOS transistors N_1 and N_2 may flow a predetermined amount of current as diodes. Accordingly, as illustrated in FIG. 7, the voltage on the complementary bit line BLB may be reduced to a predetermined level which is less than the voltage on the bit line BL.

In the above-described first to fourth examples (Cases I to IV), the complementary bit line BLB is increased or decreased to the predetermined level as compared to the bit line BL, and thus the bit line BL and the complementary bit line BLB have a predetermined voltage difference. Such a voltage difference may be interpreted as an offset voltage due to the offset noise. This means that the offset noise of sense amplifier 150 may be cancelled by causing the bit line BL and the complementary bit line BLB to have a difference by the offset voltage. That is, sense amplifier 150 may compensate for the offset through the offset cancelling operation.

Figure 6C:
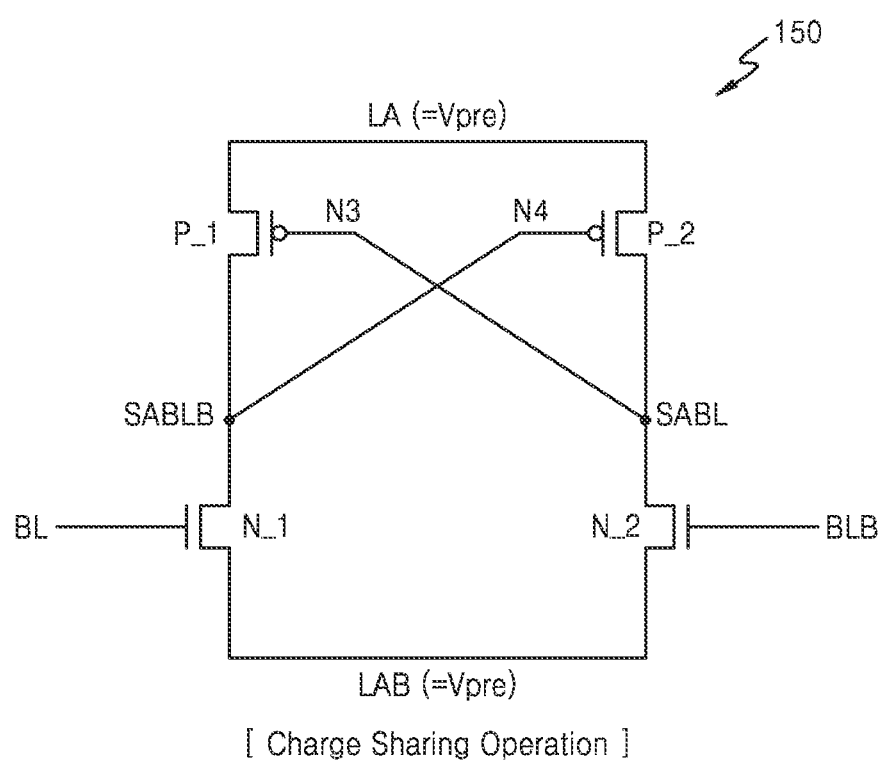

Referring to FIG. 6C, in operation S530 of FIG. 5, sense amplifier 150 performs a charge sharing operation. For example, the isolation signals ISO and the offset cancellation signals OC may be logic low (L).

The first and second isolation transistors ISO_1 and ISO_2 and the first and second offset cancellation transistors OC_1 and OC_2 are turned off in response to the isolation signal ISO and the offset cancellation signal OC of logic low (L). In this case, the word line WL connected to the memory cell MC (see FIG. 3) is activated, and the charge sharing operation is performed between electric charges stored in the cell capacitor of the memory cell MC and electric charges stored in the bit line BL.

For example, when data having a value of '1' is stored in the memory cell MC, a voltage level of the bit line BL may be increased by a predetermined amount during the charge sharing operation. On the other hand, when data having a value of '0' is stored in the memory cell MC, the voltage level of the bit line BL may be decreased by a predetermined amount during the charge sharing operation.

Figure 6D:
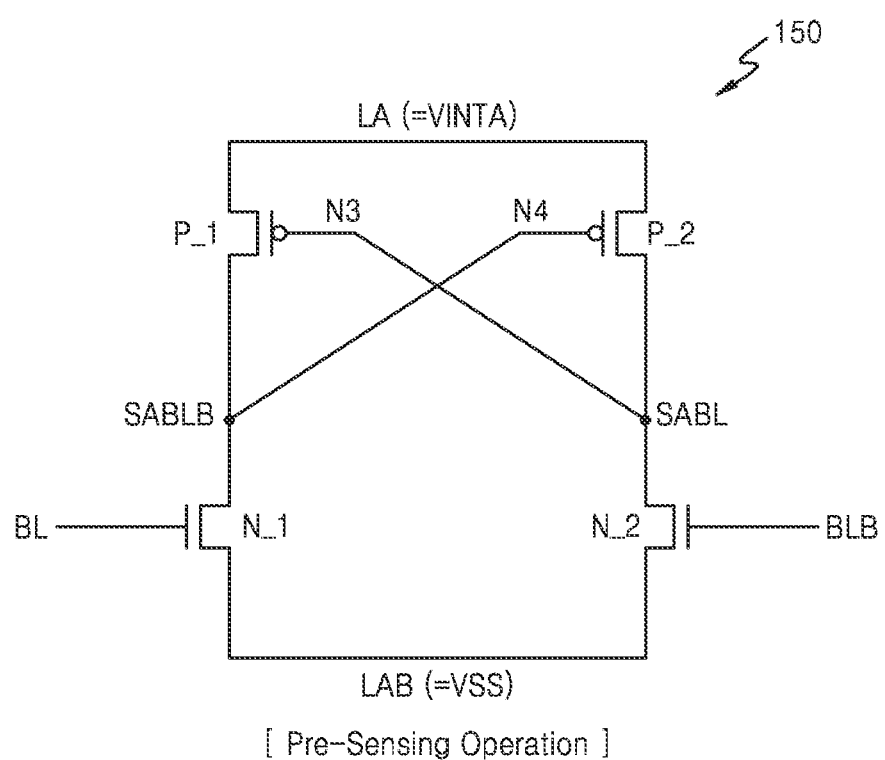

Referring to FIG. 6D, in operation S540 of FIG. 5, sense amplifier 150 performs a pre-sensing operation. For example, the isolation signals ISO and the offset cancellation signals OC may be logic low (L).

When the charge sharing operation described in FIG. 6C is performed, the voltage of the bit line BL may be increased or decreased by a predetermined amount (ΔV) according to the data stored in the memory cell MC. In this case, the first control signal LA is transitioned to an internal supply voltage VINTA and the second control signal LAB is transitioned to a ground voltage VSS. Accordingly, sense amplifier 150 may charge each of the voltages of the sensing bit line SABL and the complementary sensing bit line SABLB to the internal supply voltage VINTA and discharge each of the voltages of the sensing bit line SABL and the complementary sensing bit line SABLB to the ground voltage VSS based on the voltage difference between the bit line BL and the complementary bit line BLB.

For example, when data having a value of '1' is stored in the memory cell MC, the voltage on the sensing bit line SABL may be increased to the internal supply voltage VINTA and the voltage on the complementary sensing bit line SABLB may be decreased to the ground voltage VSS during the pre-sensing operation. On the other hand, when data having a value of '0' is stored in the memory cell MC, the voltage on the sensing bit line SABL may be decreased to the ground voltage VSS and the voltage on the complementary sensing bit line SABLB may be increased to the internal supply voltage VINTA.

For example, during the pre-sensing operation, the bit line BL and the complementary bit line BLB, and the sensing bit line SABL and the complementary sensing bit line SABLB are disconnected from each other by the first and second isolation transistors ISO 1 and ISO 2 and the first and second offset cancellation transistors OC_1 and OC_2. As the sense amplifier 150 is separated from the bit line BL and the complementary bit line BLB, a coupling effect between the bit lines BL may be reduced and a sensing rate may be improved.

Figure 6E:
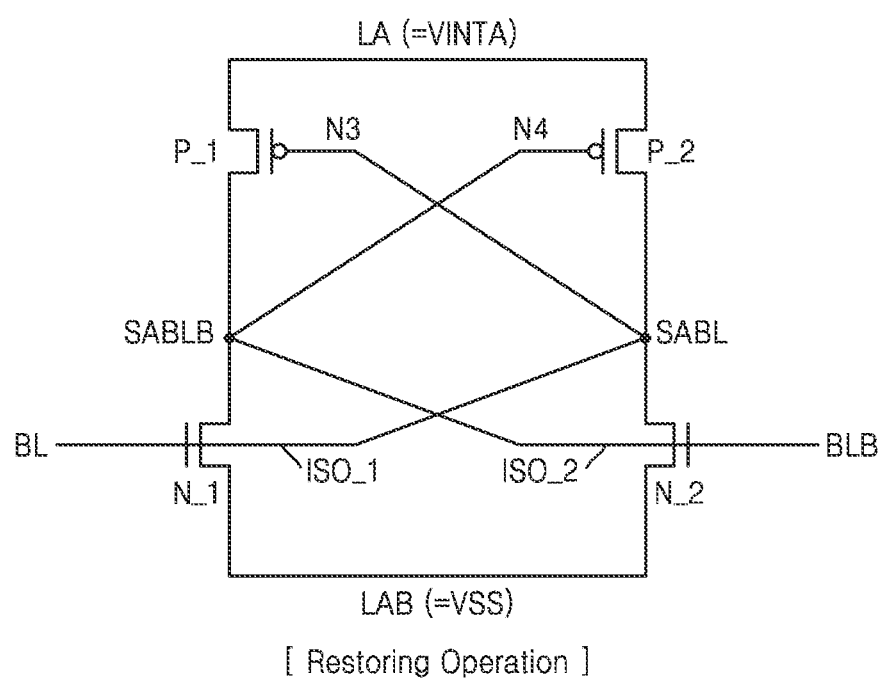

Referring to FIG. 6E, in operation S550 of FIG. 5, sense amplifier 150 performs a restoring operation. For example, the isolation signals ISO may be logic high (H), and the offset cancellation signals OC may be logic low (L).

The first and second isolation transistors ISO_1 and ISO_2 are turned on in response to the isolation signals ISO of logic high (H), and the first and second offset cancellation transistors OC_1 and OC_2 are turned off in response to the offset cancellation signals OC of logic low (L). In this case, the bit line BL and the sensing bit line SABL are connected by the first isolation transistor ISO_1, and the complementary bit line BLB and the complementary sensing bit line SABLB are connected by the second isolation transistor ISO_2. Accordingly, the voltage on the bit line BL may be increased or decreased to a voltage level of the sensing bit line SABL, and the voltage on the complementary bit line BLB may be increased or decreased to a voltage level of the complementary sensing bit line SABLB.

In some embodiments, a sensing bit line pair SABL and SABLB of sense amplifier 150 may be connected to a data line and data may be output to a local sense amplifier, a global sense amplifier, or the data input-and-output circuit 160 (see FIG. 1) through the data line after the pre-sensing operation.

As described above, sense amplifier 150 performs the pre-charging operation, the offset cancelling operation, the charge sharing operation, the pre-sensing operation, and the restoring operation based on the isolation signals ISO, the offset cancellation signals OC, and the first and second control signals LA and LAB. In this case, sense amplifier 150 may compensate for the offset of sense amplifier 150 through the offset cancelling operation, minimize the coupling between the bit lines through the pre-sensing operation, and thus an effective sensing margin thereof may be improved. Accordingly, a sense amplifier having improved performance and a memory device including the same may be provided.

Figure 8:
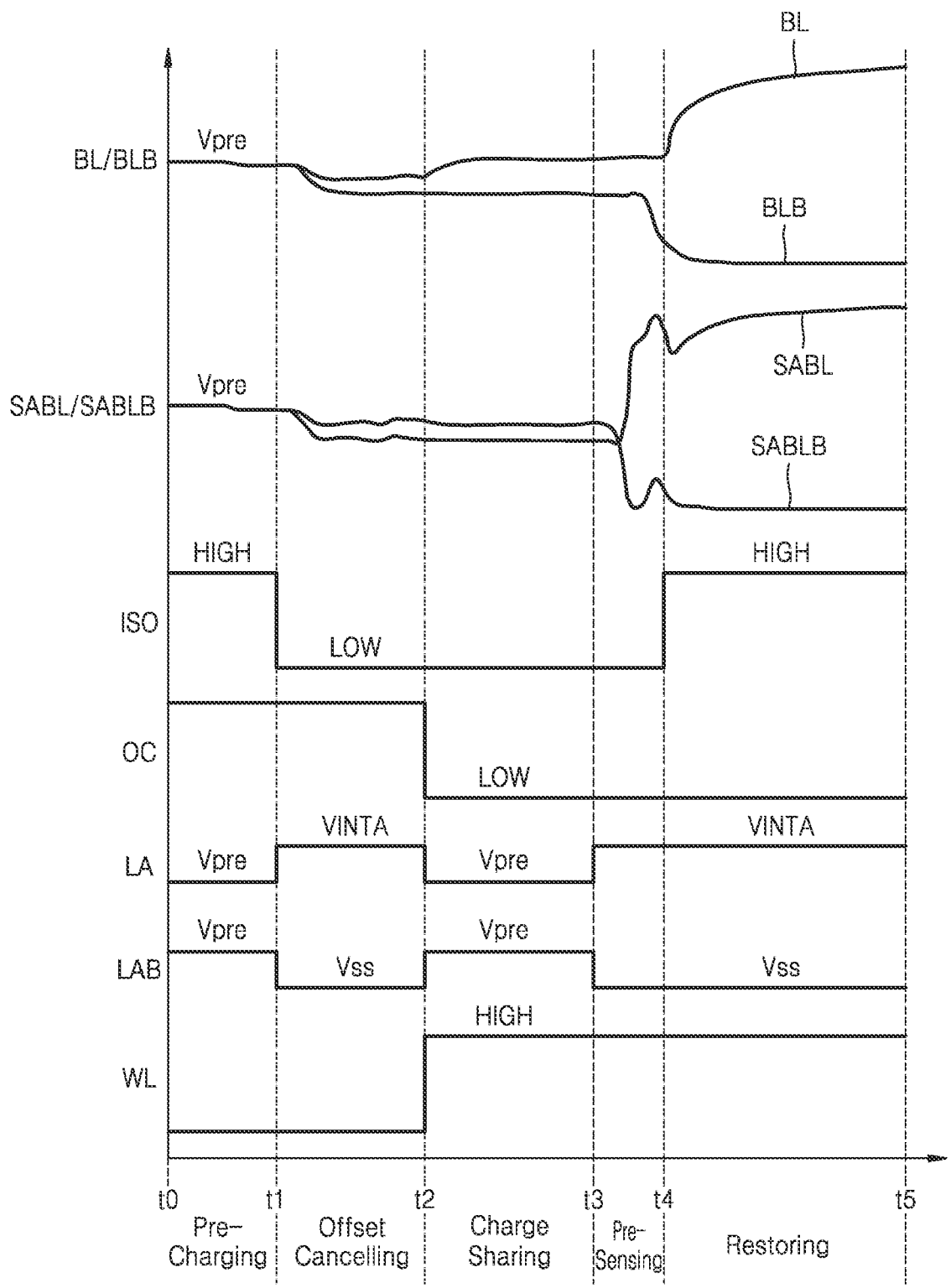
FIG. 8 is a timing diagram for describing the operations of the sense amplifier of FIG. 3.

FIG. 8 is a timing diagram for describing the operations of the sense amplifier of FIG. 3. An X-axis of FIG. 8 denotes time and a Y-axis denotes a signal level. For example, it is assumed that the memory cell MC stores data having a value of '1' and a threshold voltage of the first NMOS transistor N_1 is greater than a threshold voltage of the first NMOS transistor N_2 by an offset voltage $V_{OS}$.

Referring to FIG. 8, sense amplifier 150 sequentially performs a pre-charging operation, an offset cancelling operation, a charge sharing operation, a pre-sensing operation, and a restoring operation.

In a first interval t0-t1, sense amplifier 150 performs a pre-charging operation. In this case, an isolation signal ISO and an offset cancellation signal OC are at a logic high (H) level, and a bit line pair BL and BLB and a sensing bit line pair SABL and SABLB are precharged to a precharge voltage Vpre.

In a second interval t1-t2, sense amplifier 150 performs an offset cancelling operation. In this case, the isolation signal ISO becomes logic low (L). A first control signal LA is increased from a precharge voltage Vpre to an internal supply voltage VINTA and the second control signal LAB is reduced from a precharge voltage Vpre to a ground voltage VSS. sense amplifier 150 may perform the offset cancelling operation based on the method described in FIGS. 5 and 6B. During the offset cancelling operation, the voltage on complementary bit line BLB may be greater than the voltage on bit line BL by the offset voltage $V_{OS}$. Accordingly, the voltages on the bit line BL and the complementary bit line BLB have a difference by the offset voltage $V_{OS}$, and thus the offset noise of sense amplifier 150 may be cancelled.

In a third interval t2-t3, sense amplifier 150 performs a charge sharing operation. In this case, an isolation signal ISO and an offset cancellation signal OC become logic low (L), the word line WL connected to the memory cell MC is activated, and the charge sharing operation is performed between electric charges stored in the cell capacitor of the memory cell MC and electric charges stored in the bit line BL. When data having a value of '1' is stored in the memory cell MC, a voltage level of the bit line BL may be increased by a predetermined level during the charge sharing operation. In another embodiment, when data having a value of '0' is stored in the memory cell MC, the voltage level of the bit line BL may be reduced by a predetermined level during the charge sharing operation.

In a fourth interval t3-t4, sense amplifier 150 performs a pre-sensing operation. In this case, the first control signal LA is transitioned to the internal supply voltage VINTA and the second control signal LAB is transitioned to the ground voltage VSS. Accordingly, in sense amplifier 150, the sensing bit line SABL is increased to the internal supply voltage VINTA and the complementary sensing bit line SABLB is reduced to the ground voltage VSS, based on a voltage difference between the bit line BL and the complementary bit line BLB.

In a fifth interval t4-t5, sense amplifier 150 performs a restoring operation. In this case, the isolation signal ISO becomes logic high (H) and first and second isolation transistors ISO_1 and ISO_2 are turned on. The bit line pair BL and BLB and the sensing bit line pair SABL and SABLB are respectively connected to each other, and the bit line pair BL and BLB may be charged or discharged to the voltage level of the sensing bit line pair SABL and SABLB.

Figure 9:
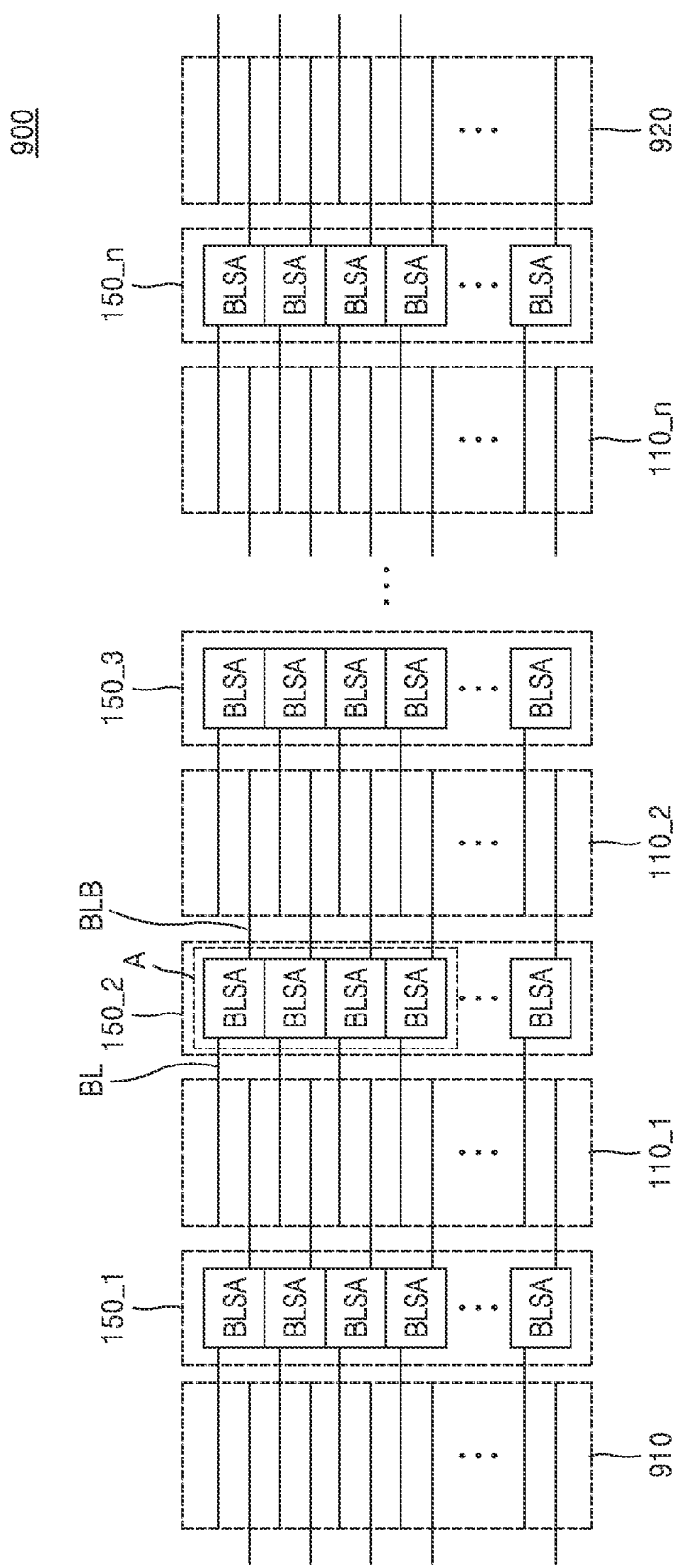
FIG. 9 is a diagram illustrating an example embodiment of a memory device to which example embodiments of a sense amplifier as described herein is applied.

FIG. 9 is a diagram illustrating an example of a memory device to which a sense amplifier according to embodiments described herein is applied.

Referring to FIG. 9, a memory device 900 includes a plurality of memory cell arrays 110_1, 110_2, . . . to 110_n and a plurality of sense amplifiers 150_1, 150_2, . . . to 150_n. Each of the plurality of sense amplifiers 150_1 to 150_n may include a plurality of bit line sense amplifiers BLSA. The bit line sense amplifiers BLSA may be implemented as sense amplifier 150 described in FIGS. 1-8.

A plurality of bit line pairs BL and BLB connected to the plurality of memory cell arrays 110_1 to 110_n may be respectively connected to the plurality of bit line sense amplifiers BLSA. Memory device 900 has an open bit line structure. In memory device 900 having an open bit line structure, when the bit line pair BL and BLB has different capacitances, a sensing operation of the bit line sense amplifier BLSA is disturbed and sensing sensitivity is reduced due to loading mismatch of the bit line pair BL and BLB.

Memory device 900 may include dummy cell arrays 910 and 920 which are disposed at edges of memory cell arrays 110_1 to 110_n in order to address the loading mismatch problem of the bit line pair BL and BLB. Some of bit lines of dummy cell arrays 910 and 920 may be connected to adjacent bit line sense amplifiers BLSA as complementary bit lines. The remaining bit lines of dummy cell arrays 910 and 920 may not be connected to the bit line sense amplifiers BLSA as dummy bit lines.

In memory device 900 of FIG. 9, even when dummy cell arrays 910 and 920 are provided, capacitances of the bit line pair BL and BLB may not be equalized. Capacitance imbalance of the bit line pair BL and BLB may act as offset noise of the bit line sense amplifier BLSA. In this case, the bit line sense amplifier BLSA may compensate for a difference due to the capacitance imbalance of the bit line pair BL and BLB based on the offset cancelling operation described in FIGS. 1 to 8.

FIGS. 10 to 17 are diagrams for describing embodiments of layouts and layout methods of a sense amplifier, such as sense amplifier 150 described above with respect to FIGS. 1-8. FIGS. 10 to 17 each illustrate a region A of a layout of the plurality of sense amplifiers 150_2 of FIG. 9. In FIGS. 10 to 17, the pair of PMOS transistors, including first and second PMOS transistors P_1 and P_2, the pair of NMOS transistors, including first and second NMOS transistors N_1 and N_2, the first and second isolation transistors ISO_1 and ISO_2, and the first and second offset cancellation transistors OC_1 and OC_2 of sense amplifier 150, which are illustrated in FIG. 3, are disposed in one bit line sense amplifier BLSA in plurality of sense amplifiers 150_2.

Figure 10:
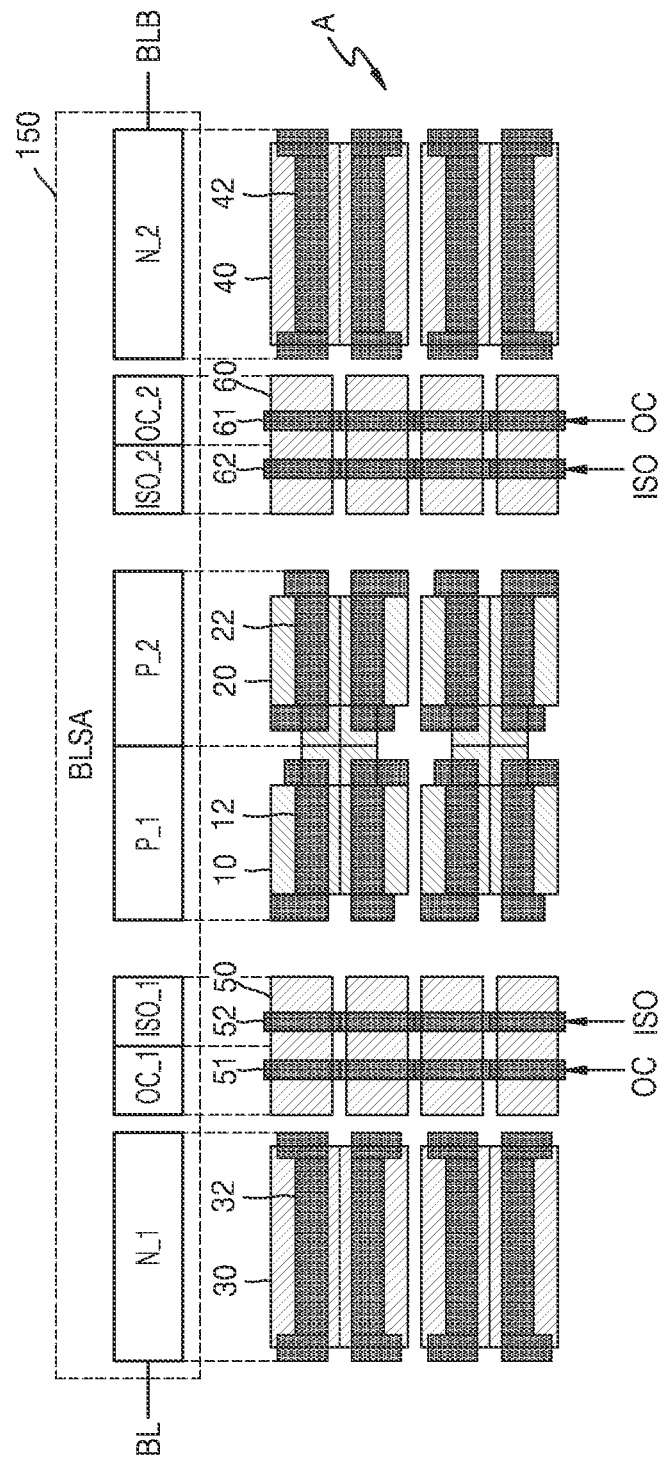
FIGS. 10, 11, 12, 13, 14, 15, 16 and 17 are diagrams for describing embodiments of layouts and layout methods of a sense amplifier.

Referring to FIG. 10, the bit line sense amplifier BLSA is disposed between the bit line BL and the complementary bit line BLB. The pair of PMOS transistors, i.e., first and second PMOS transistors P_1 and P_2, may be disposed in a central region of the bit line sense amplifier BLSA, and the first NMOS transistor N_1 may be disposed adjacent to the bit line BL and the second NMOS transistor N_2 may be disposed adjacent to the complementary bit line BLB. In this embodiment, the pair of NMOS transistors, i.e., first and second NMOS transistors N_1 and N_2 are disposed at opposite sides of the bit line sense amplifier BLSA from each other, at the edges of bit line sense amplifier BLSA. In this embodiment, the pair of PMOS transistors, i.e., first and second PMOS transistors P_1 and P_2, are disposed in between the pair of NMOS transistors, i.e., first and second NMOS transistors N_1 and N_2.

The first PMOS transistor P_1 may include an active pattern 10 and a gate pattern 12 and the second PMOS transistor P_2 may include an active pattern 20 and a gate pattern 22. The first NMOS transistor N_1 may include an active pattern 30 and a gate pattern 32 and the second NMOS transistor N_2 may include an active pattern 40 and a gate pattern 42.

The first offset cancellation transistor OC_1 and the first isolation transistor ISO_1 may be disposed between the first NMOS transistor N_1 and the first PMOS transistor P_1. The first offset cancellation transistor OC_1 may be disposed adjacent to the first NMOS transistor N_1 and the first isolation transistor ISO_1 may be disposed adjacent to the first PMOS transistor P_1. The first offset cancellation transistor OC_1 and the first isolation transistor ISO_1 may share a common active pattern 50, and having corresponding gate patterns 51 and 52, respectively.

The second offset cancellation transistor OC_2 and the second isolation transistor ISO_2 may be disposed between the second NMOS transistor N_2 and the second PMOS transistor P_2. The second offset cancellation transistor OC_2 may be disposed adjacent to the second NMOS transistor N_2 and the second isolation transistor ISO_2 may be disposed adjacent to the second PMOS transistor P_2. The second offset cancellation transistor OC_2 and the second isolation transistor ISO 2 may include an active pattern 60 and gate patterns 61 and 62, respectively. Gate patterns 51 and 61 are conductive lines through which offset cancellation signals OC are transferred and gate patterns 52 and 62 are conductive lines through which isolation signals ISO are transferred.

Figure 11:
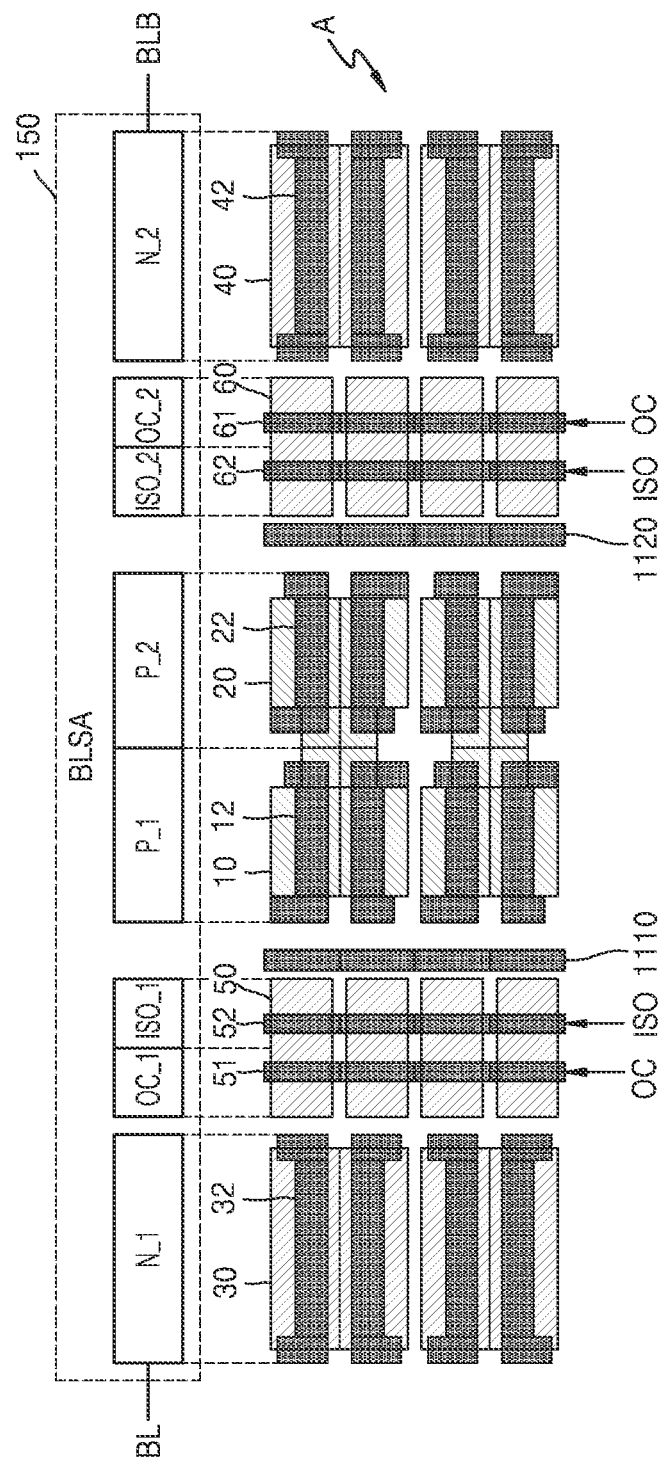

Referring to FIG. 11, a bit line sense amplifier BLSA differs from the bit line sense amplifier BLSA of FIG. 10 in that it further includes dummy conductive lines 1110 and 1120. Hereinafter, layouts of bit line sense amplifiers BLSA of FIGS. 11 to 17 will be mainly described on differences from the layout of the bit line sense amplifier BLSA of FIG. 10.

In FIG. 11, dummy conductive lines 1110 and 1120 may be respectively disposed between the first PMOS transistor P_1 and the first isolation transistor ISO_1 and between the second PMOS transistor P_2 and the second isolation transistor ISO_2.

The first and second PMOS transistors P_1 and P_2 which are P-type transistors and the first and second isolation transistors ISO 1 and ISO 2 which are N-type transistors are separated from each other by a process design rule, and respective distances between the first and second PMOS transistors P_1 and P_2 and the first and second isolation transistors ISO_1 and ISO_2 may be greater than respective distances between the first and second NMOS transistors N_1 and N_2 and the first and second offset cancellation transistors OC_1 and OC_2, which are the same N-type transistors. A difference between the respective distances may act as a step in a subsequent wiring process of the bit line sense amplifier BLSA. A region in which such a step is formed may cause sensing imbalance of the bit line sense amplifier BLSA.

In order to prevent the sensing imbalance of the bit line sense amplifier BLSA, dummy conductive lines 1110 and 1120 may be respectively disposed between the first and second PMOS transistors P_1 and P_2 and the first and second isolation transistors ISO 1 and ISO 2.

Figure 12:
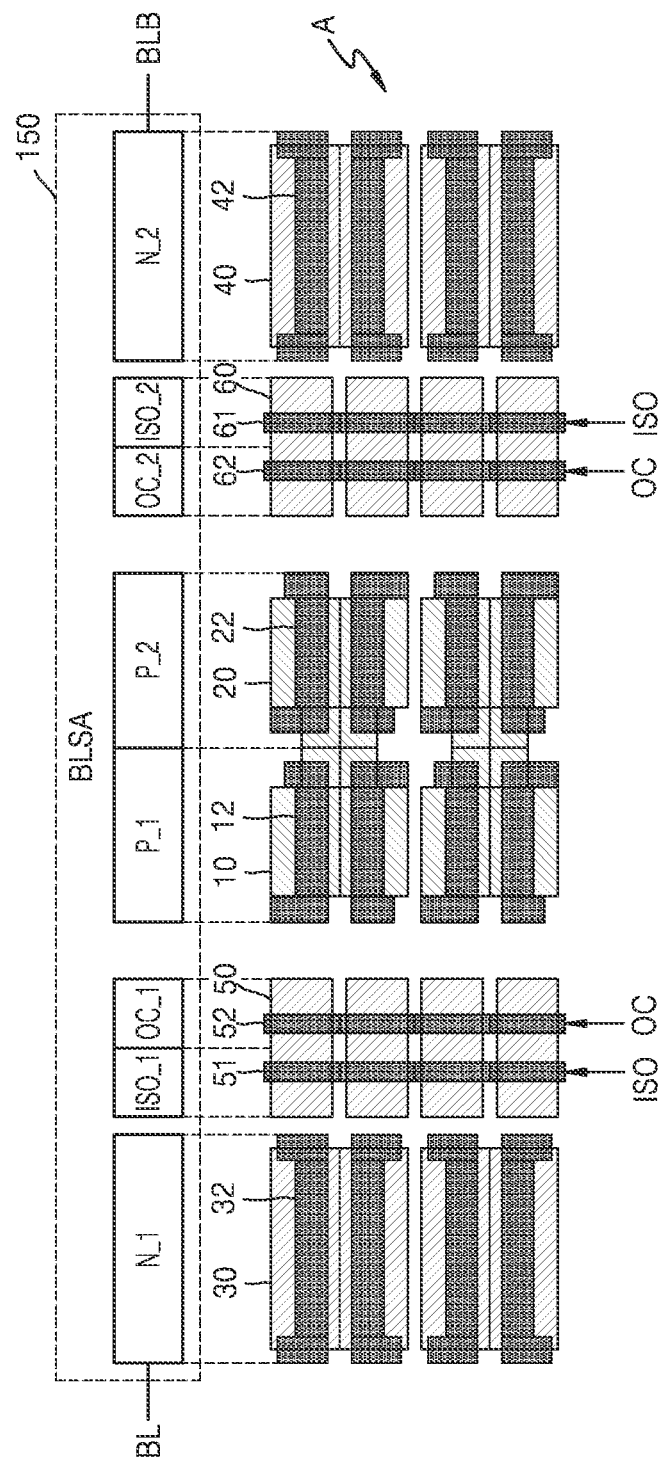

Referring to FIG. 12, a bit line sense amplifier BLSA differs from the bit line sense amplifier BLSA of FIG. 10 in that the first offset cancellation transistor OC_1 and the first isolation transistor ISO 1 between the first NMOS transistor N_1 and the first PMOS transistor P_1 are switched with each other and the second offset cancellation transistor OC_2 and the second isolation transistor ISO 2 between the second NMOS transistor N_2 and the second PMOS transistor P_2 are switched with each other.

The first isolation transistor ISO_1 may be disposed adjacent to the first NMOS transistor N_1 and the first offset cancellation transistor OC_1 may be disposed adjacent to the first PMOS transistor P_1. The second isolation transistor ISO_2 may be disposed adjacent to the second NMOS transistor N_2 and the second offset cancellation transistor OC_2 may be disposed adjacent to the second PMOS transistor P_2.

Figure 13:
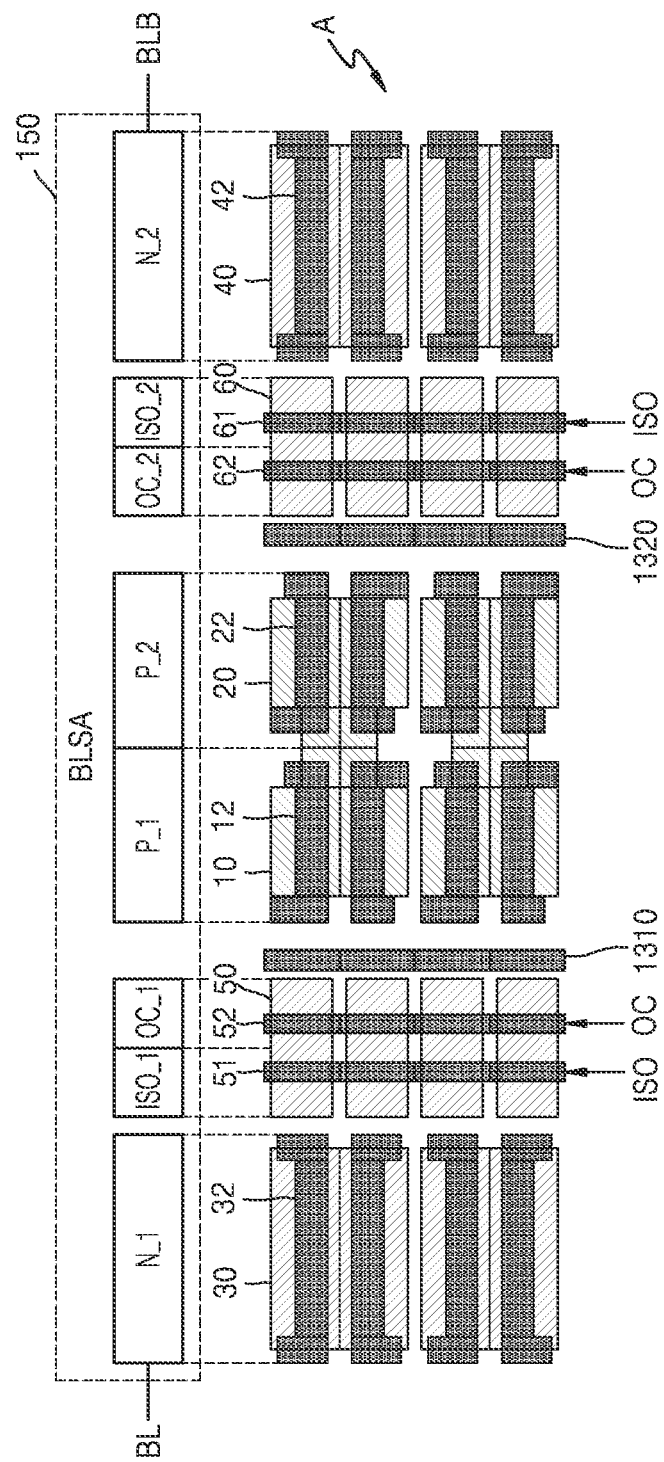

Referring to FIG. 13, a bit line sense amplifier BLSA differs from the bit line sense amplifier BLSA of FIG. 12 in that it further includes dummy conductive lines 1310 and 1320. Dummy conductive lines 1310 and 1320 are respectively disposed between the first PMOS transistor P_1 and the first offset cancellation transistor OC_1 and between the second PMOS transistor P_2 and the second offset cancellation transistor OC_2.

Figure 14:
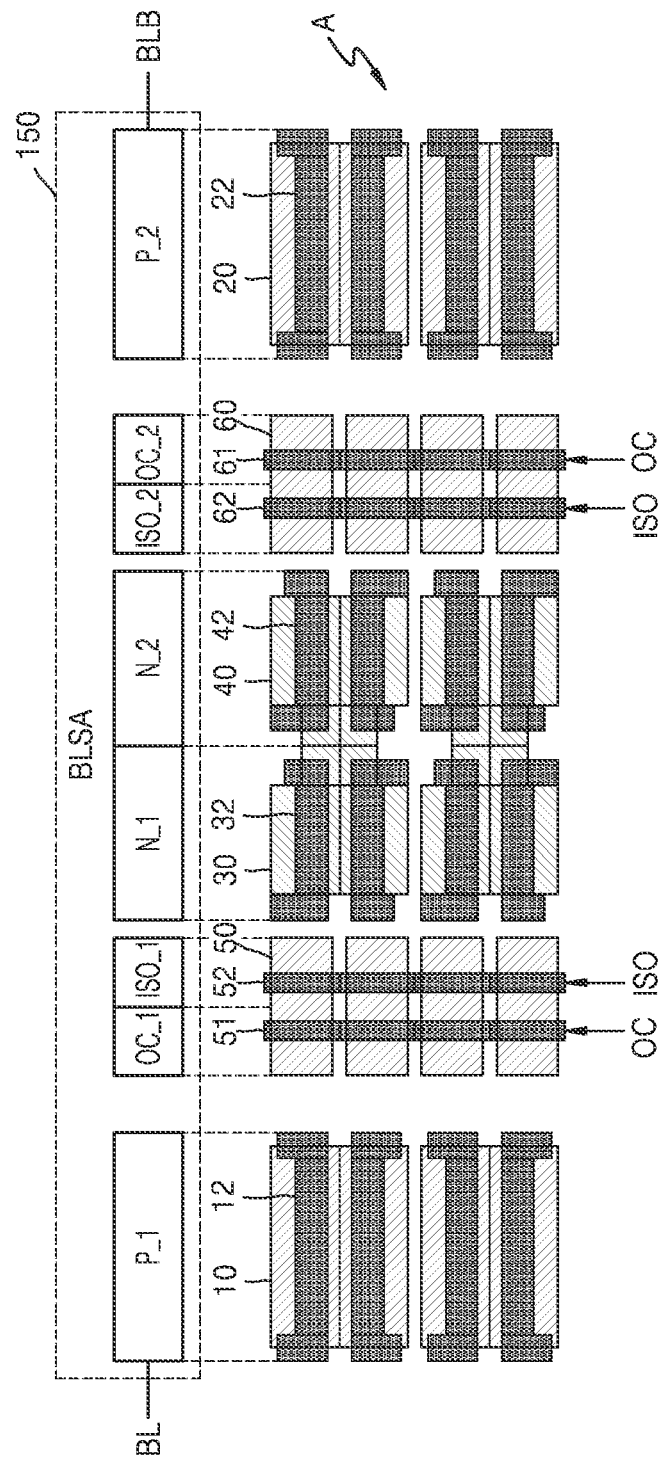

Referring to FIG. 14, a bit line sense amplifier BLSA differs from the bit line sense amplifier BLSA of FIG. 10 in that pair of NMOS transistors, i.e., the first and second NMOS transistors N_1 and N_2, may be disposed in a central region of the bit line sense amplifier BLSA, and the first PMOS transistor P_1 may be disposed adjacent to the bit line BL and the second PMOS transistor P_2 may be disposed adjacent to the complementary bit line BLB. In this embodiment, the pair of PMOS transistors, i.e., first and second PMOS transistors P_1 and P_2 are disposed at opposite sides of the bit line sense amplifier BLSA from each other, at the edges of bit line sense amplifier BLSA. In this embodiment, the pair of NMOS transistors, i.e., first and second NMOS transistors N_1 and N_2, are disposed in between the pair of PMOS transistors, i.e., first and second PMOS transistors P_1 and P_2.

The first offset cancellation transistor OC_1 and the first isolation transistor ISO_1 may be disposed between the first PMOS transistor P_1 and the first NMOS transistor N_1. The first offset cancellation transistor OC_1 may be disposed adjacent to the first PMOS transistor P_1 and the first isolation transistor ISO_1 may be disposed adjacent to the first NMOS transistor N_1.

The second offset cancellation transistor OC_2 and the second isolation transistor ISO_2 may be disposed between the second PMOS transistor P_2 and the second NMOS transistor N_2. The second offset cancellation transistor OC_2 may be disposed adjacent to the second PMOS transistor P_2 and the second isolation transistor ISO_2 may be disposed adjacent to the second NMOS transistor N_2.

Figure 15:
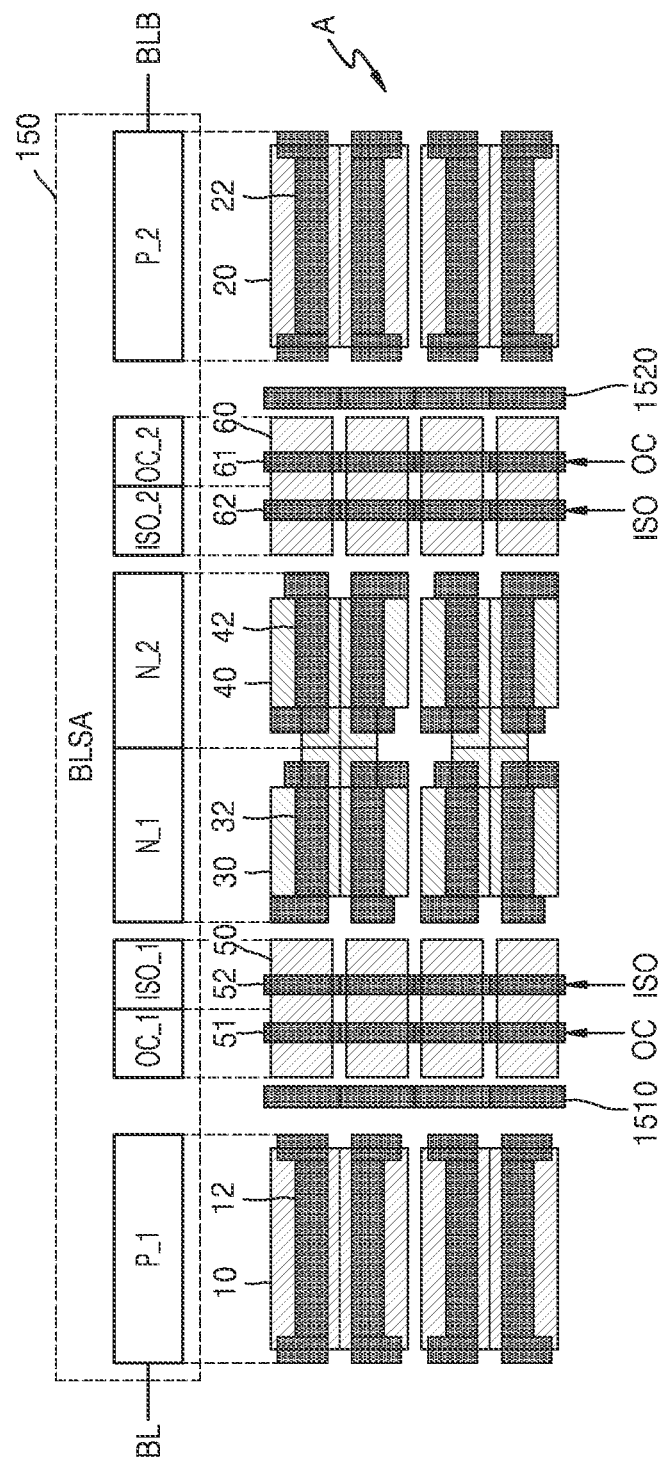

Referring to FIG. 15, a bit line sense amplifier BLSA differs from the bit line sense amplifier BLSA of FIG. 14 in that it further includes dummy conductive lines 1510 and 1520. Dummy conductive lines 1510 and 1520 may be respectively disposed between the first PMOS transistor P_1 and the first offset cancellation transistor OC_1 and between the second PMOS transistor P_2 and the second offset cancellation transistor OC_2.

In some embodiments, dummy conductive lines 1510 and 1520 may be respectively disposed between the first NMOS transistor N_1 and the first isolation transistor ISO 1 and between the second NMOS transistor N_2 and the second isolation transistor ISO 2.

Figure 16:
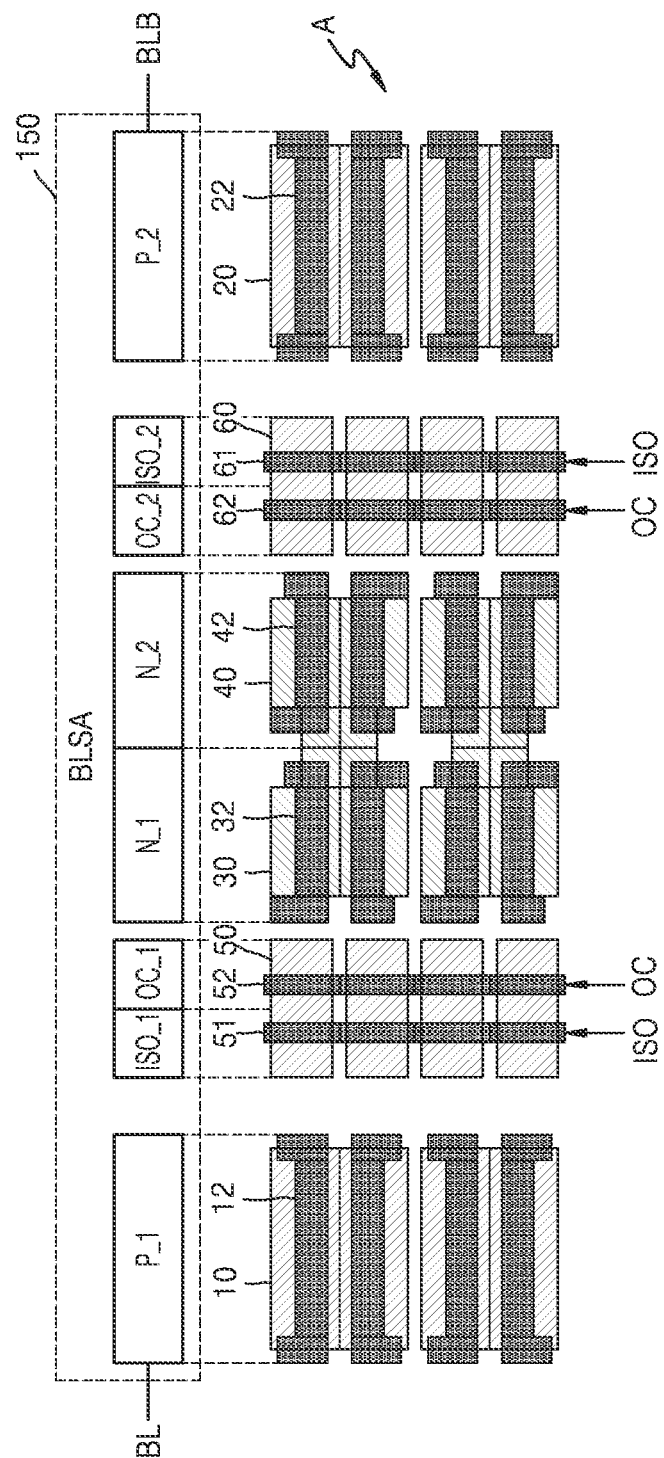

Referring to FIG. 16, a bit line sense amplifier BLSA differs from the bit line sense amplifier BLSA of FIG. 14 in that the first offset cancellation transistor OC_1 and the first isolation transistor ISO 1 between the first PMOS transistor P_1 and the first NMOS transistor N_1 are switched with each other and the second offset cancellation transistor OC_2 and the second isolation transistor ISO 2 between the second PMOS transistor P_2 and the second NMOS transistor N_2 are switched with each other.

The first isolation transistor ISO_1 may be disposed adjacent to the first PMOS transistor P_1 and the first offset cancellation transistor OC_1 may be disposed adjacent to the first NMOS transistor N_1. The second isolation transistor ISO_2 may be disposed adjacent to the second PMOS transistor P_2 and the second offset cancellation transistor OC_2 may be disposed adjacent to the second NMOS transistor N_2.

Figure 17:
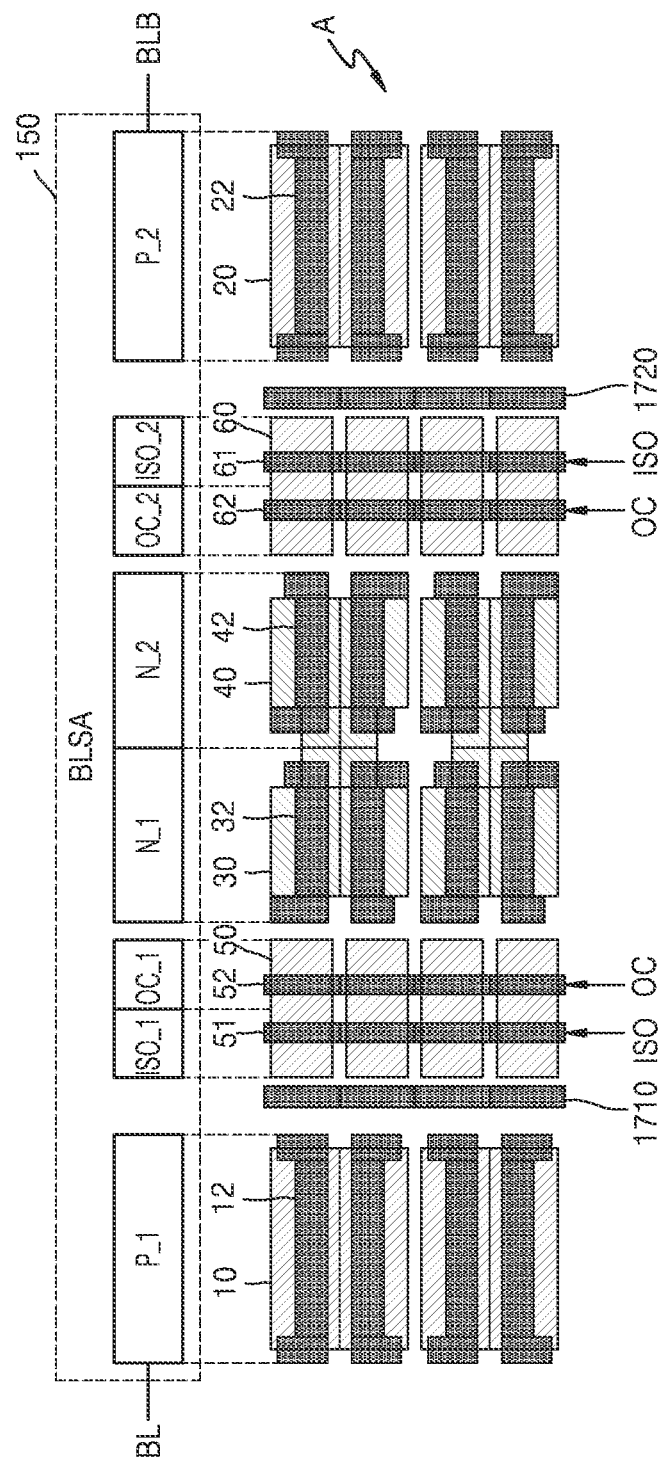

Referring to FIG. 17, a bit line sense amplifier BLSA differs from the bit line sense amplifier BLSA of FIG. 16 in that it further includes dummy conductive lines 1710 and 1720. Dummy conductive lines 1710 and 1720 may be respectively disposed between the first PMOS transistor P_1 and the first isolation transistor ISO_1 and between the second PMOS transistor P_2 and the second isolation transistor ISO_2.

In some embodiments, dummy conductive lines 1710 and 1720 may be respectively disposed between the first NMOS transistor N_1 and the first offset cancellation transistor OC_1 and between the second NMOS transistor N_2 and the second offset cancellation transistor OC_2.

In the various embodiments of layouts as described above with respect to FIGS. 10-17, either: the NMOS transistors are disposed at opposite sides of the sense amplifier from each other, and the PMOS transistors are disposed in a central region of the sense amplifier between the NMOS transistors, or the PMOS transistors are disposed at the opposite sides of the sense amplifier from each other, and the NMOS transistors are disposed in the central region of the sense amplifier between the PMOS transistors.

Figure 18:
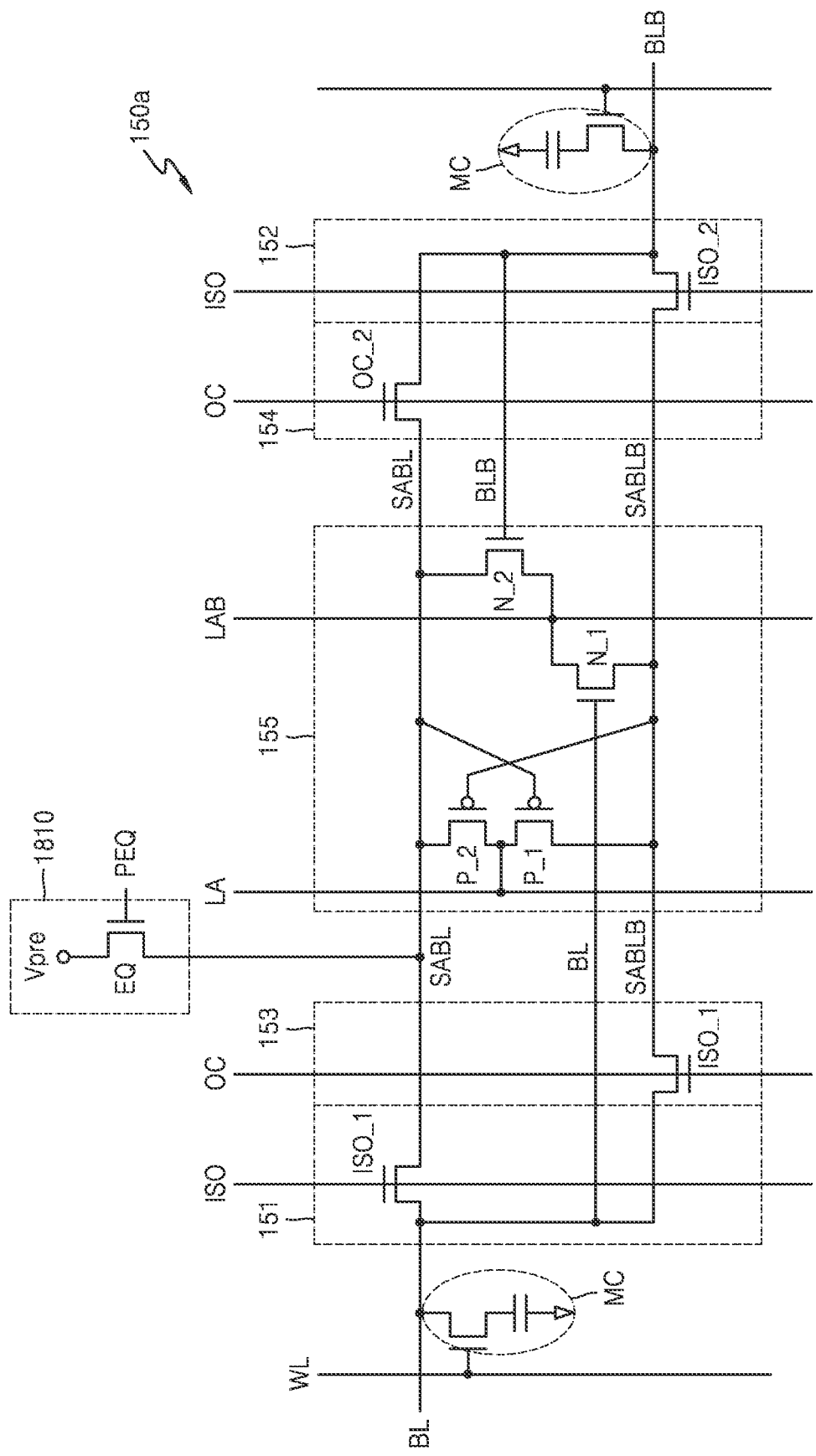
FIG. 18 is a circuit diagram for describing another embodiment of a sense amplifier.

FIG. 18 is a circuit diagram for describing another embodiment of a sense amplifier.

Referring to FIG. 18, a sense amplifier 150a further includes an equalizer 1810 as compared to sense amplifier 150 of FIG. 3. Hereinafter, a difference between sense amplifier 150a of FIG. 18 and sense amplifier 150 of FIG. 3 will be mainly described.

Equalizer 1810 includes an equalizing transistor EQ connected between a sensing bit line SABL and a precharge voltage line carrying the precharge voltage Vpre. A gate of the equalizing transistor EQ is connected to an equalizing control line carrying an equalizing signal PEQ.

Equalizer 1810 may equalize a bit line pair BL and BLB and a sensing bit line pair SABL and SABLB to the precharge voltage Vpre. For example, during a pre-charging operation of sense amplifier 150a, the bit line pair BL and BLB and the sensing bit line pair SABL and SABLB may be connected to one node when isolation signals ISO and offset cancellation signals OC are logic high (H). In this case, equalizer 1810 may charge and equalize the bit line pair BL and BLB and the sensing bit line pair SABL and SABLB to the precharge voltage Vpre in response to the equalizing signal PEQ having a logic high (H) level.

Figure 19:
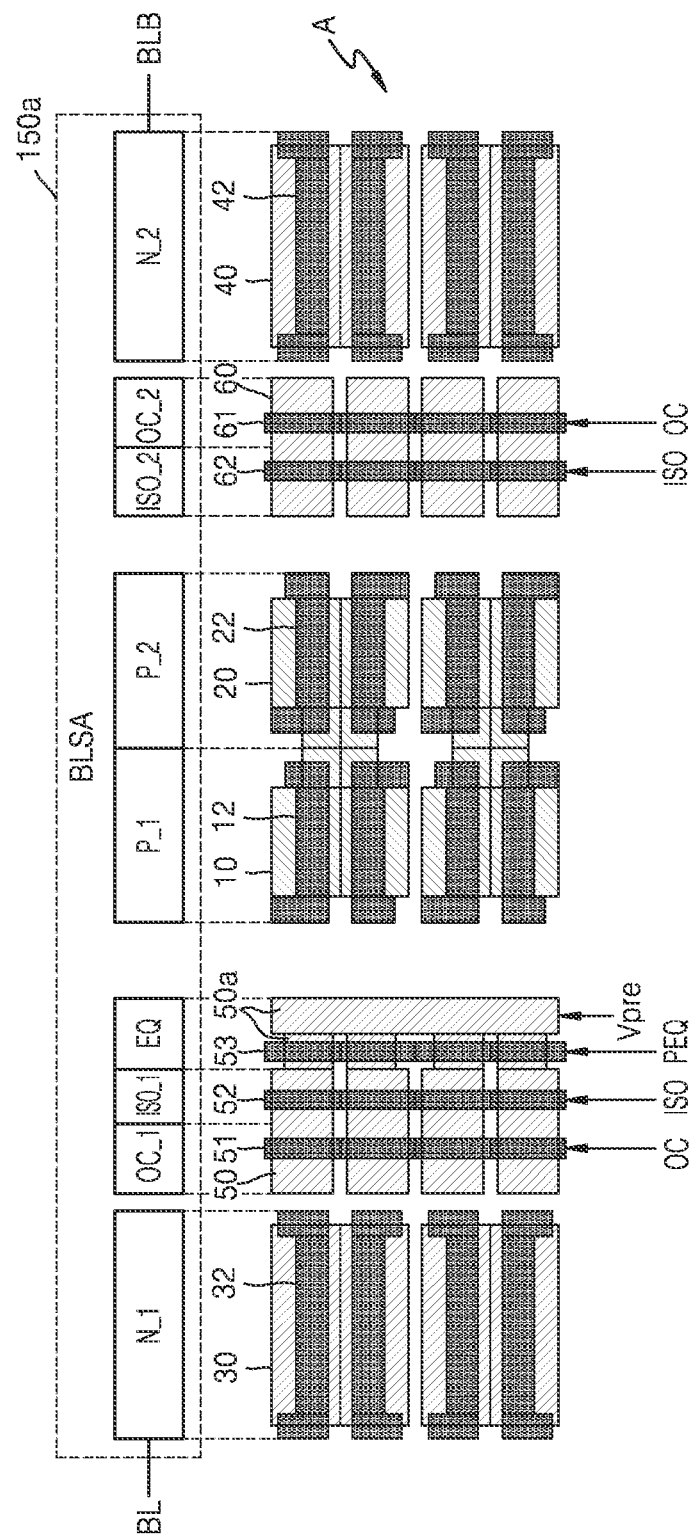
FIGS. 19 and 20 are diagrams for describing embodiments of layouts and layout methods of the sense amplifier of FIG. 18.
Figure 20:
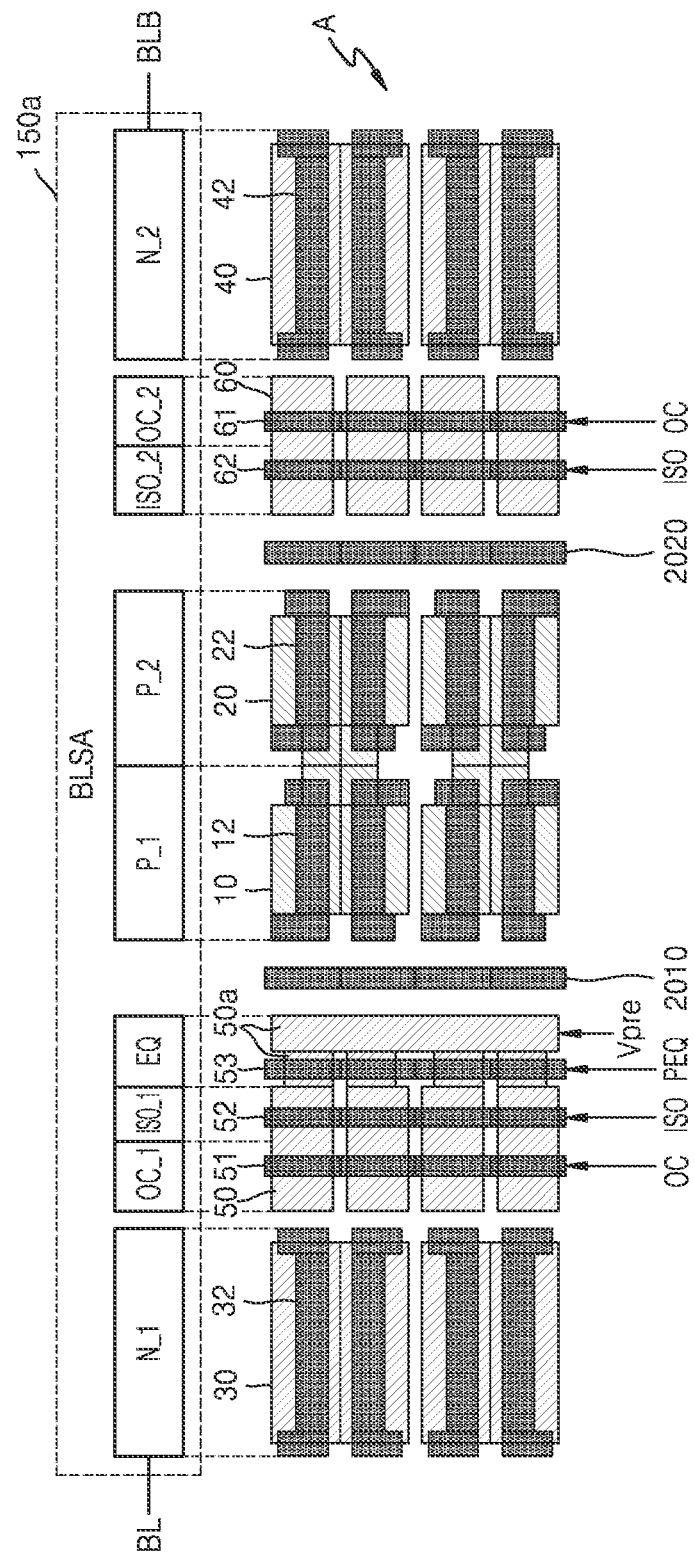

FIGS. 19 and 20 are diagrams for describing embodiments of layouts and layout methods of sense amplifier of FIG. 18. A layout of the sense amplifier of FIGS. 19 and 20 corresponds to a region A of the layouts of the bit line sense amplifiers BLSA in the plurality of sense amplifiers 150_2 described in FIG. 9, and a difference from the layout of the sense amplifier of FIG. 10 will be mainly described.

Referring to FIG. 19, a bit line sense amplifier BLSA differs from the bit line sense amplifier BLSA of FIG. 10 in that an equalizing transistor EQ is further disposed between the first PMOS transistor P_1 and the first isolation transistor ISO_1. The equalizing transistor EQ may include an active pattern 50a and a gate pattern 53. One side of active pattern 50a may be in contact with the common active pattern 50 of the first offset cancellation transistor OC_1 and the first isolation transistor ISO 1 and the precharge voltage Vpre may be applied to another side of active pattern 50a via a precharge voltage line. Gate pattern 53 is a conductive equalizing control line through which an equalizing signal PEQ is transferred.

In some embodiments, in the bit line sense amplifier BLSA of FIG. 19, the first offset cancellation transistor OC_1 and the first isolation transistor ISO_1 may be switched with each other and the second offset cancellation transistor OC_2 and the second isolation transistor ISO_2 may be switched with each other.

In some embodiments, in the bit line sense amplifier BLSA of FIG. 19, the pair of NMOS transistors, i.e., the first and second NMOS transistors N_1 and N_2 may be disposed in a central region of the bit line sense amplifier BLSA, and the first PMOS transistor P_1 may be disposed adjacent to the bit line BL and the second PMOS transistor P_2 may be disposed adjacent to the complementary bit line BLB. In such embodiments, the pair of PMOS transistors, i.e., first and second PMOS transistors P_1 and P_2 may be disposed at opposite sides of the bit line sense amplifier BLSA from each other, at the edges of bit line sense amplifier BLSA. In such embodiments, the pair of NMOS transistors, i.e., first and second NMOS transistors N_1 and N_2, may be disposed in between the pair of PMOS transistors, i.e., first and second PMOS transistors P_1 and P_2.

Referring to FIG. 20, a bit line sense amplifier BLSA differs from the bit line sense amplifier BLSA of FIG. 19 in that it further includes dummy conductive lines 2010 and 2020. Dummy conductive lines 2010 and 2020 may be respectively disposed between the first PMOS transistor P_1 and the equalizing transistor EQ and between the second PMOS transistor P_2 and the second isolation transistor ISO 2.

In some embodiments, in the bit line sense amplifier BLSA of FIG. 20, the first offset cancellation transistor OC_1 and the first isolation transistor ISO_1 may be switched with each other and the second offset cancellation transistor OC_2 and the second isolation transistor ISO_2 may be switched with each other.

In some embodiments, in the bit line sense amplifier BLSA of FIG. 20, the pair of NMOS transistors, i.e., the first and second NMOS transistors N_1 and N_2 may be disposed in a central region of the bit line sense amplifier BLSA, and the first PMOS transistor P_1 may be disposed adjacent to the bit line BL and the second PMOS transistor P_2 may be disposed adjacent to the complementary bit line BLB. In such embodiments, the pair of PMOS transistors, i.e., first and second PMOS transistors P_1 and P_2 may be disposed at opposite sides of the bit line sense amplifier BLSA from each other, at the edges of bit line sense amplifier BLSA. In such embodiments, the pair of NMOS transistors, i.e., first and second NMOS transistors N_1 and N_2, may be disposed in between the pair of PMOS transistors, i.e., first and second PMOS transistors P_1 and P_2.

Figure 21:
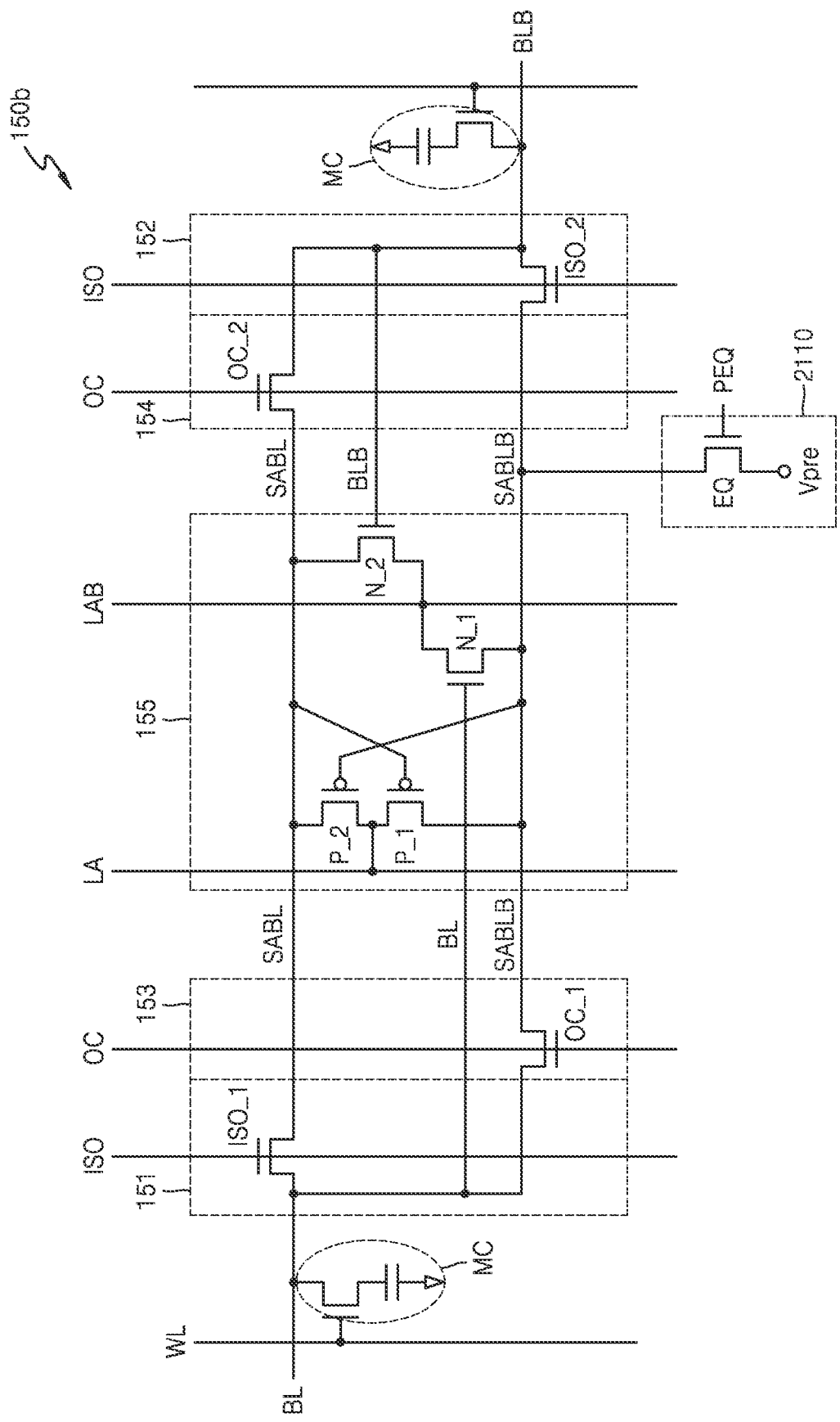
FIG. 21 is a circuit diagram for describing still another embodiment of a sense amplifier.

FIG. 21 is a circuit diagram for describing still another embodiment of a sense amplifier.

Referring to FIG. 21, as compared to sense amplifier 150a of FIG. 18, a sense amplifier 150b has an equalizer 2110 connected between a complementary sensing bit line SABL and a precharge voltage line carrying the precharge voltage Vpre.

Equalizer 2110 may equalize a bit line pair BL and BLB and a sensing bit line pair SABL and SABLB to the precharge voltage Vpre. For example, during a pre-charging operation of sense amplifier 150b, the bit line pair BL and BLB and the sensing bit line pair SABL and SABLB may be connected to one node when isolation signals ISO and offset cancellation signals OC are logic high (H). In this case, equalizer 2110 may charge and equalize the bit line pair BL and BLB and the sensing bit line pair SABL and SABLB to the precharge voltage Vpre in response to an equalizing signal PEQ of logic high (H).

Figure 22:
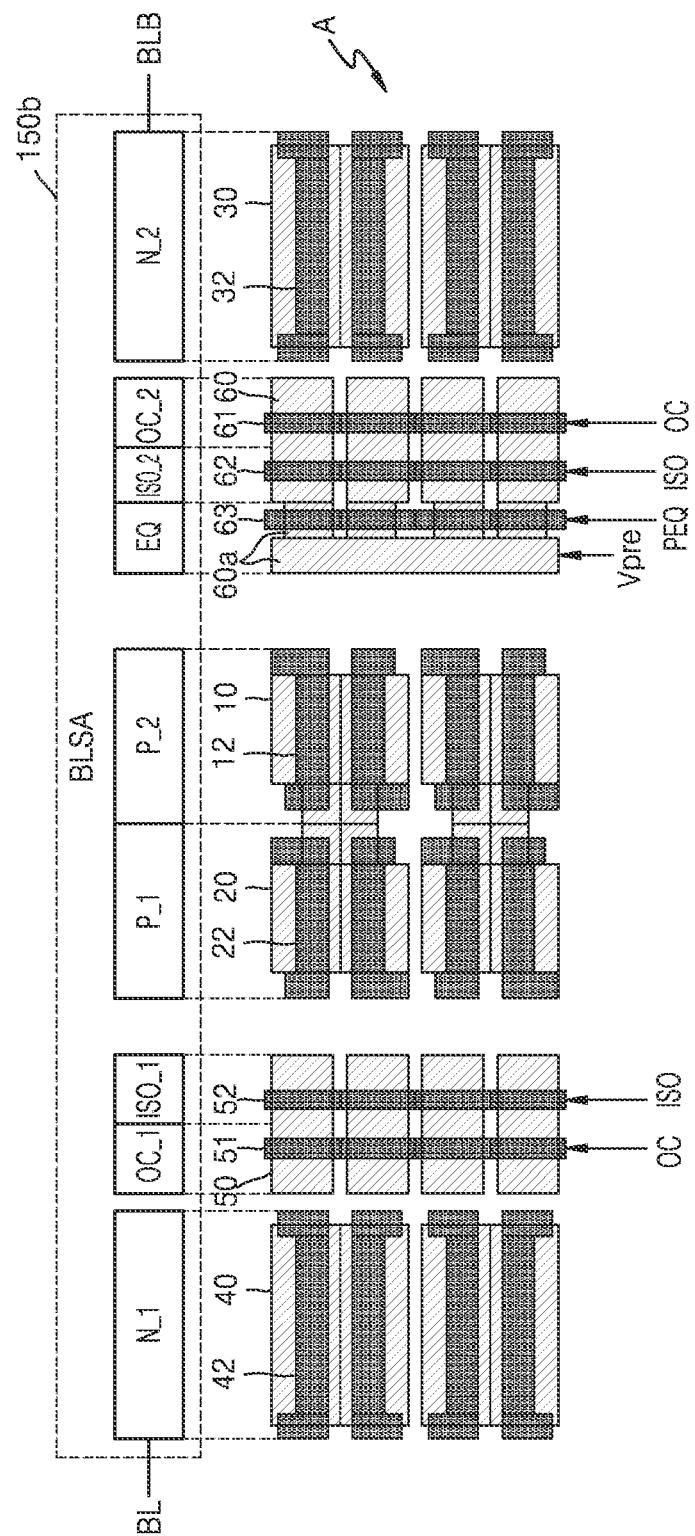
FIGS. 22 and 23 are diagrams for describing embodiments of layouts and layout methods of the sense amplifier of FIG. 21.
Figure 23:
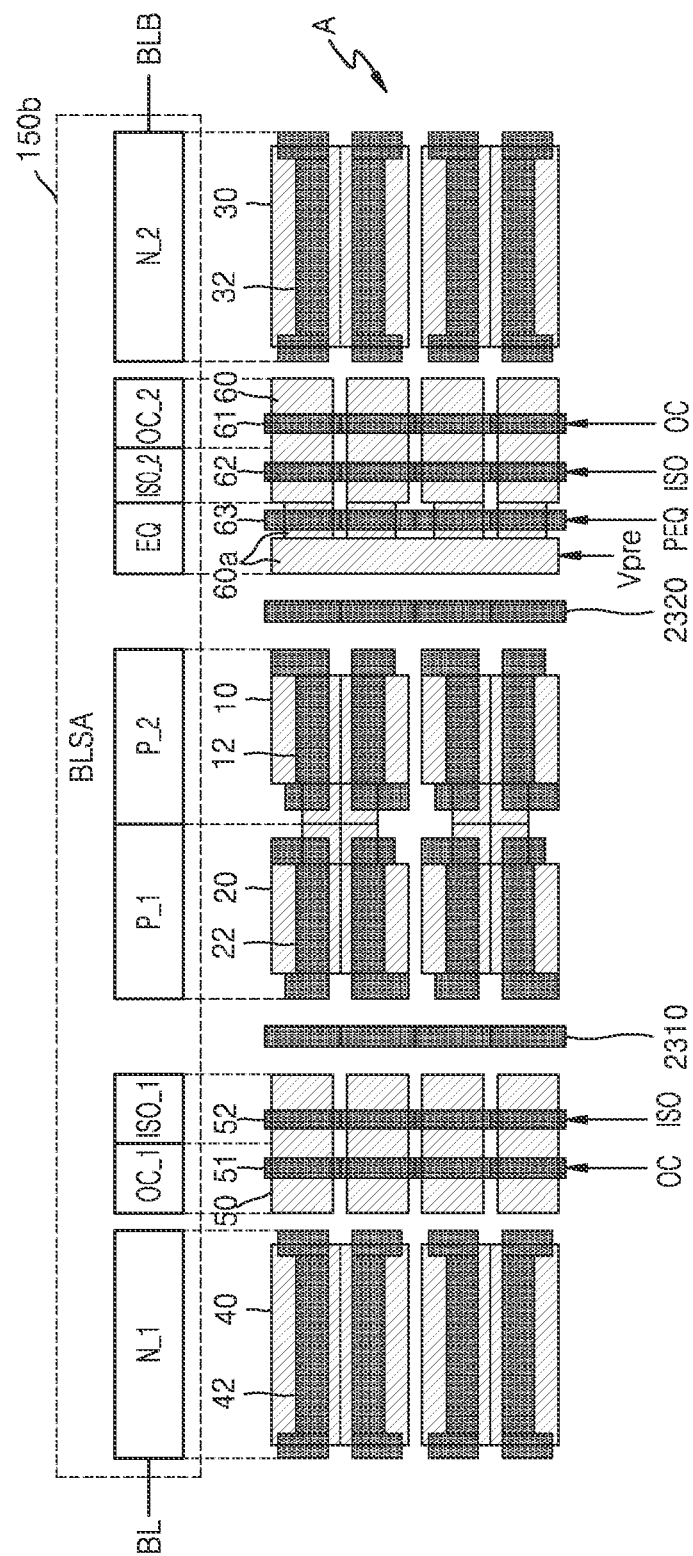

FIGS. 22 and 23 are diagrams for describing embodiments of layouts and layout methods of the sense amplifier of FIG. 21.

Referring to FIG. 22, a bit line sense amplifier BLSA has an equalizing transistor EQ disposed between the second PMOS transistor P_2 and the second isolation transistor ISO_2 as compared to the bit line sense amplifier BLSA of FIG. 19. The equalizing transistor EQ may include an active pattern 60a and a gate pattern 63. One side of active pattern 60a may be in contact with active pattern 60 of FIG. 10 and a precharge voltage Vpre may be applied to another side of active pattern 60a via a precharge voltage line. Gate pattern 63 is a conductive equalizing control line through which an equalizing signal PEQ is transferred.

In some embodiments, in the bit line sense amplifier BLSA of FIG. 22, the first offset cancellation transistor OC_1 and the first isolation transistor ISO_1 may be switched with each other and the second offset cancellation transistor OC_2 and the second isolation transistor ISO_2 may be switched with each other.

In some embodiments, in the bit line sense amplifier BLSA of FIG. 22, the pair of NMOS transistors, i.e., the first and second NMOS transistors N_1 and N_2 may be disposed in a central region of the bit line sense amplifier BLSA, and the first PMOS transistor P_1 may be disposed adjacent to the bit line BL and the second PMOS transistor P_2 may be disposed adjacent to the complementary bit line BLB. In such embodiments, the pair of PMOS transistors, i.e., first and second PMOS transistors P_1 and P_2 may be disposed at opposite sides of the bit line sense amplifier BLSA from each other, at the edges of bit line sense amplifier BLSA. In such embodiments, the pair of NMOS transistors, i.e., first and second NMOS transistors N_1 and N_2, may be disposed in between the pair of PMOS transistors, i.e., first and second PMOS transistors P_1 and P_2.

Referring to FIG. 23, a bit line sense amplifier BLSA further includes dummy conductive lines 2310 and 2320 as compared to the bit line sense amplifier BLSA of FIG. 22. Dummy conductive lines 2310 and 2320 may be respectively disposed between the first PMOS transistor P_1 and the first isolation transistor ISO_1 and between the second PMOS transistor P_2 and the equalizing transistor EQ.

In some embodiments, in the bit line sense amplifier BLSA of FIG. 23, the first offset cancellation transistor OC_1 and the first isolation transistor ISO_1 may be switched with each other and the second offset cancellation transistor OC_2 and the second isolation transistor ISO_2 may be switched with each other.

In some embodiments, in the bit line sense amplifier BLSA of FIG. 23, the pair of NMOS transistors, i.e., the first and second NMOS transistors N_1 and N_2, may be disposed in a central region of the bit line sense amplifier BLSA, and the first PMOS transistor P_1 may be disposed adjacent to the bit line BL and the second PMOS transistor P_2 may be disposed adjacent to the complementary bit line BLB. In such embodiments, the pair of PMOS transistors, i.e., first and second PMOS transistors P_1 and P_2 may be disposed at opposite sides of the bit line sense amplifier BLSA from each other, at the edges of bit line sense amplifier BLSA. In such embodiments, the pair of NMOS transistors, i.e., first and second NMOS transistors N_1 and N_2, may be disposed in between the pair of PMOS transistors, i.e., first and second PMOS transistors P_1 and P_2.

In the various embodiments of layouts as described above with respect to FIGS. 19, 20, 22 and 23, either: the NMOS transistors are disposed at opposite sides of the sense amplifier from each other, and the PMOS transistors are disposed in a central region of the sense amplifier between the NMOS transistors, or the PMOS transistors are disposed at the opposite sides of the sense amplifier from each other, and the NMOS transistors are disposed in the central region of the sense amplifier between the PMOS transistors.

Figure 24:
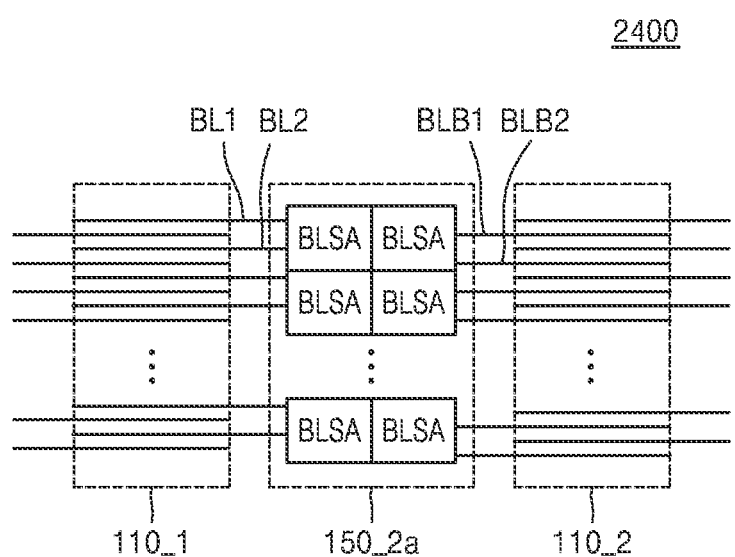
FIGS. 24 and 25 are diagrams illustrating example embodiments of a memory device to which a sense amplifier according to the embodiments described herein may be applied.
Figure 25:
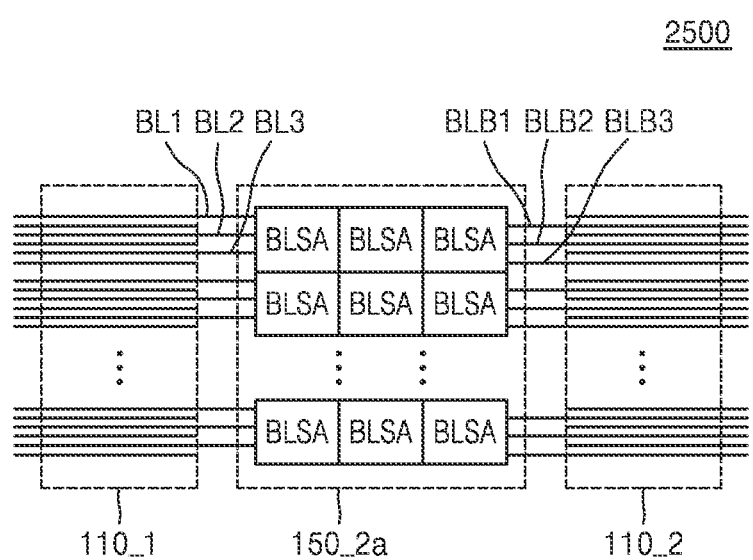

FIGS. 24 and 25 are diagrams illustrating example embodiments of a memory device to which a sense amplifier as described herein may be applied. FIGS. 24 and 25 are diagrams illustrating portions corresponding to first and second memory cell arrays 110_1 and 110_2 and second sense amplifiers 150_2, which are some portions of plurality of memory cell arrays 110_1 to 110_n and plurality of sense amplifiers 150_1 to 150_n described above in FIG. 9. Each of second sense amplifiers 150_2 may include a plurality of bit line sense amplifiers BLSA. The bit line sense amplifiers BLSA may be implemented as sense amplifiers 150, 150a, or 150b described in FIGS. 1 to 23.

In a memory device 2400 of FIG. 24, two bit line sense amplifiers BLSA in second sense amplifiers 150_2a are disposed adjacent to each other, unlike in memory device 900 of FIG. 9. The two bit line sense amplifiers BLSA may be connected to first and second bit lines BL1 and BL2 and first and second complementary bit lines BLB1 and BLB2. One of the two bit line sense amplifiers BLSA may sense a voltage variation between the first bit line pair BL1 and BLB1 and the other thereof may sense a voltage variation between the second bit line pair BL2 and BLB2.

In a memory device 2500 of FIG. 25, three bit line sense amplifiers BLSA 3 in second sense amplifiers 150_2b are disposed adjacent to one another, unlike in memory device 900 of FIG. 9. The three bit line sense amplifiers BLSA may be connected to first to third bit lines BL1 to BL3 and first to third complementary bit lines BLB1 to BLB3. Each of the three bit line sense amplifiers BLSA may sense a voltage variation between each of the first to third bit line pairs (BL1 and BLB1), (BL2 and BLB2), and (BL3 and BLB3).

Memory devices 2400 and 2500 of FIGS. 24 and 25 may be selectively applied according to a trend, in which a size of a unit cell is reduced, due to miniaturization in a design rule caused by the highly integrated memory cell device. In some embodiments, n bit line sense amplifiers BLSA may be disposed adjacent to each other, the n bit line sense amplifiers BLSA may be connected to first to $n^{th}$ bit lines BL1 to BLn and first to $n^{th}$ complementary bit lines BLB1 to BLBn, and each of the n bit line sense amplifiers BLSA may sense a voltage variation of each of first to $n^{th}$ bit line pairs (BL1 and BLB1) to (BLn and BLBn).

In memory devices 2400 and 2500, a plurality of bit line sense amplifiers BLSA arranged in a matrix, including a plurality of rows each extending between first memory cell array 110_1 and second memory cell array 110_2 along a first direction, and a plurality of columns each extending along a second direction which is perpendicular to the first direction. At least one of the rows and at least one of the columns each includes more than one of the plurality of bit line sense amplifiers BLSA, and typically there may be multiple bit line sense amplifiers BLSA in each row and in each column.

Figure 26:
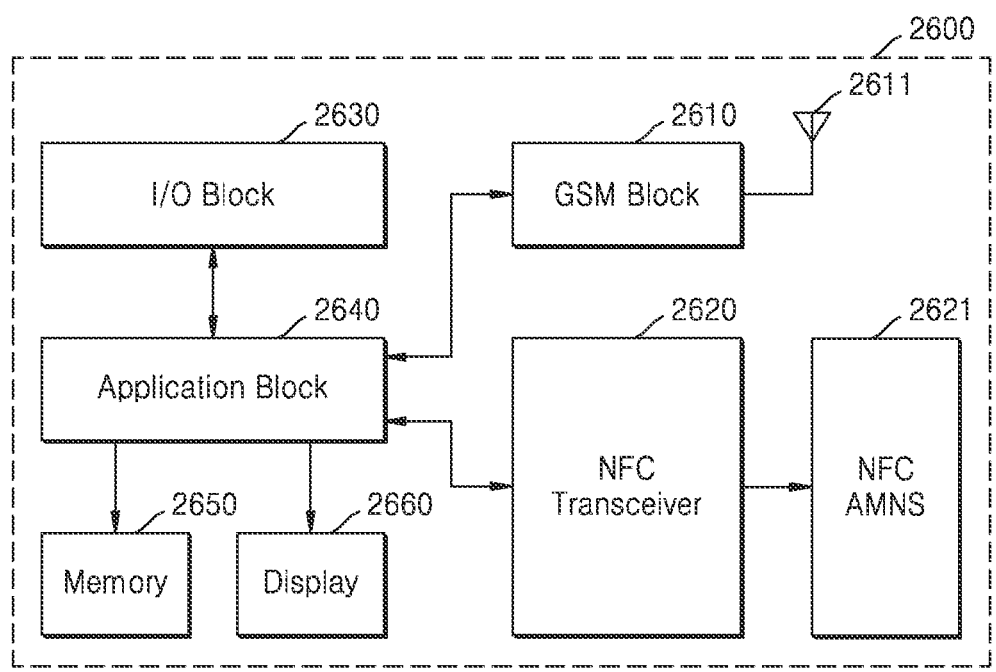
FIG. 26 is a block diagram illustrating an example in which a memory device including a sense amplifier according to the embodiments described herein is applied to a mobile device.

FIG. 26 is a block diagram illustrating an example embodiment in which a memory device including a sense amplifier as described herein is applied to a mobile device. The mobile device may be a mobile phone or a smart phone.

Referring to FIG. 26, a mobile device 2600 includes a Global System for Mobile Communications (GSM) block 2610, a near-field communication (NFC) transceiver 2620, an input-and-output block 2630, an application block 2640, a memory 2650, and a display 2660. The components or blocks of mobile device 2600 in FIG. 26 are illustrated as examples. Mobile device 2600 may include more or fewer components or blocks. Also, although the components or blocks using GSM technology are illustrated in the present embodiment, mobile device 2600 may be implemented using other technologies such as code division multiple access (CDMA). The blocks of FIG. 26 may be implemented in the form of an integrated circuit. Alternatively, while some of the blocks may be implemented in the form of an integrated circuit, other blocks may be implemented in a separate form.

GSM block 2610 may be connected to an antenna 2611 and may operate to provide operations of a wireless phone in a known manner. GSM block 2610 may include a receiver and a transmitter therein and perform corresponding receiving and transmitting operations.

NFC transceiver 2620 may be configured to transmit and receive NFC signals using inductive coupling for wireless communication. NFC transceiver 2620 may provide the NFC signals to an NFC antenna matching network system 2621 and the NFC antenna matching network system 2621 may transmit the NFC signals using inductive coupling. The NFC antenna matching network system 2621 may receive NFC signals provided from another NFC device and provide the received NFC signals to NFC transceiver 2620.

Application block 2640 may include hardware circuits, for example, one or more processors and may operate to provide various user applications provided by mobile device 2600. The user applications may include voice call operations, data transmission, data swapping, and the like. Application block 2640 may operate in conjunction with GSM block 2610 and/or NFC transceiver 2620 and provide operation characteristics of GSM block 2610 and/or NFC transceiver 2620. Alternatively, application block 2640 may include a program for mobile point of sale (POS). Such a program may provide a credit card purchase and payment function using a mobile phone, e.g., a smart phone.

Display 2660 may display an image in response to display signals received from application block 2640. The image may be provided from application block 2640 or may be generated by a camera embedded in mobile device 2600. Display 2660 may include a frame buffer therein for temporarily storing pixel values, and may be configured as a liquid crystal display screen with associated control circuits.

Input-and-output block 2630 provides an input function to a user, and provides outputs to be received through application block 2640.

Memory 2650 may store programs (instructions) and/or data to be used by application block 2640, and may be implemented as a random-access memory (RAM), a read-only memory (ROM), a flash memory, or the like. Therefore, memory 2650 may include non-volatile memory devices as well as volatile memory devices. For example, memory 2650 may correspond to memory device 100, 900, 2400, or 2500 described in FIGS. 1 to 25.

Memory 2650 may include a sense amplifier for improving an effective sensing margin based on an operation of cancelling an offset of the sense amplifier. The sense amplifier may include a sense amplifying unit, a first isolation unit, a second isolation unit, a first offset cancellation unit, and a second offset cancellation unit, and the sense amplifying unit may include a first PMOS transistor, a second PMOS transistor, a first NMOS transistor, and a second NMOS transistor.

In some embodiments of memory 2650, the pair of PMOS transistors, i.e., the first and second PMOS transistors may be disposed in a central region of the sense amplifier, the pair of NMOS transistors, i.e., the first and second NMOS transistors may be respectively disposed at opposite sides of the sense amplifier from each other, the first isolation unit and the first offset cancellation unit may be disposed between the first PMOS transistor and the first NMOS transistor, and the second isolation unit and the second offset cancellation unit may be disposed between the second PMOS transistor and the second NMOS transistor.

In other embodiments of memory 2650, the pair of NMOS transistors, i.e., the first and second NMOS transistors may be disposed in a central region of the sense amplifier, the pair of PMOS transistors, i.e., the first and second PMOS transistors may be respectively disposed at opposite sides of the sense amplifier from each other, the first isolation unit and the first offset cancellation unit may be disposed between the first NMOS transistor and the first PMOS transistor, and the second isolation unit and the second offset cancellation unit may be disposed between the second NMOS transistor and the second PMOS transistor.

While the inventive concept has been particularly shown and described with reference to embodiments thereof, it will be understood that various changes in form and details may be made therein without departing from the spirit and scope of the following claims.

What is claimed is:

1. A method of operating a sense amplifier for dynamic random access memory (DRAM) device, the method comprising:
    performing a pre-charging operation on a bit line pair and a sensing bit line pair while maintaining an isolation signal and an offset cancellation signal logic high, the bit line pair comprising a bit line and a complementary bit line and the sensing bit line pair comprising a sensing bit line and a complementary sensing bit line;
    performing an offset cancelling operation by transitioning the isolation signal logic low and transitioning a first control signal from a first precharge voltage to an internal supply voltage, and transitioning a second control signal from the first precharge voltage to a ground voltage;
    performing a charge sharing operation by transitioning the offset cancellation signal logic low and activating a word line, thereby sharing charges stored in a memory cell coupled to the word line with the bit line and transitioning both the first control signal and the second control signal to the first precharge voltage;
    performing a pre-sensing operation by transitioning the first control signal to the internal supply voltage, and transitioning the second control signal to the ground voltage, thereby sensing operation being performed on the sensing bit line pair; and
    performing a restoring operation by transitioning the isolation signal logic high, thereby connecting the bit lines pairs and the sensing bit line pair,
    wherein the sense amplifier comprises:
        first isolation transistor configured to connect the bit line to the sensing bit line in response to the isolation signal;
        second isolation transistor configured to connect the complementary bit line to the complementary sensing bit line in response to the isolation signal;
        first offset compensation transistor configured to connect the bit line to the complementary sensing bit line in response to the offset cancellation signal;
        second offset compensation transistor configured to connect the complementary bit line to the sensing bit line in response to the offset cancellation signal; and
        a sense amplifying unit configured to sense and amplify a voltage difference between the bit line and the complementary bit line, the sense amplifying unit including first and second P-type metal oxide semiconductor (PMOS) transistors and first and second N-type metal oxide semiconductor (NMOS) transistors, wherein the first isolation transistor and the first offset compensation transistor are disposed between the first PMOS transistor and the first NMOS transistor, and the second isolation transistor and the second offset compensation transistor are disposed between the second PMOS transistor and the second NMOS transistor.

2. The method of claim 1, wherein the first and second isolation transistors are turned-on when the isolation signal is logic high and connect the bit line pair to the sensing bit line pair.

3. The method of claim 1, wherein the first offset compensation transistor is turned-on when the offset cancellation signal is logic high for connecting the bit line to the complementary sensing bit line, and the second offset compensation transistor is turned-on when the offset cancellation signal is logic high for connecting the complementary bit line to the sensing bit line.

4. The method of claim 3, wherein the offset canceling operation cancels offset voltage of the sense amplifier by forming a voltage difference on the bit line pairs and the sensing bit line pairs that cancels the offset voltage.

5. The method of claim 1, wherein the sense amplifier further comprising an equalizer connected between a pre-charge voltage line and one of the sensing bit line and the complementary sensing bit line for precharging the sensing bit line and the complementary sensing bit line.

6. The method of claim 5, wherein the equalizer is disposed between the first PMOS transistor and the first NMOS transistor.

7. The method of claim 1, wherein the isolation transistor and the offset compensation transistor share a common active pattern, and each has a corresponding gate pattern.

8. The method of claim 1, wherein the first control signal is connected to source nodes of the first and second PMOS transistors.

9. The method of claim 1, wherein the second control signal is connected to source nodes of the first and second NMOS transistors.

10. The method of claim 1, wherein the first precharge voltage is substantially half level of the internal supply voltage.

11. A method of operating a sense amplifier for dynamic random access memory (DRAM) device, the method comprising:
performing a pre-charging operation on a bit line pair and a sensing bit line pair while maintaining an isolation signal and an offset cancellation signal logic high, the bit line pair comprising a bit line and a complementary bit line and the sensing bit line pair comprising a sensing bit line and a complementary sensing bit line;
performing an offset cancelling operation by transitioning the isolation signal logic low and transitioning a first control signal from a first precharge voltage to an internal supply voltage, and transitioning a second control signal from the first precharge voltage to a ground voltage;
performing a charge sharing operation by transitioning the offset cancellation signal logic low and activating a word line, thereby sharing charges stored in a memory cell coupled to the word line with the bit line and transitioning both the first control signal and the second control signal to the first precharge voltage;
performing a pre-sensing operation by transitioning the first control signal to the internal supply voltage, and transitioning the second control signal to the ground voltage, thereby sensing operation being performed on the sensing bit line pair; and
performing a restoring operation by transitioning the isolation signal logic high, thereby connecting the bit lines pairs and the sensing bit line pair, wherein the sense amplifier comprises:
a first set including a first dummy conductive line, a first PMOS transistor, a first NMOS transistor, a first isolation transistor and a first offset cancellation transistor, and the first dummy conductive line being disposed adjacent to the first PMOS transistor, wherein the first dummy conductive line, the first isolation transistor and the first offset cancellation transistor are disposed between the first PMOS transistor and the first NMOS transistor; and
a second set including a second dummy conductive line, a second PMOS transistor, a second NMOS transistor, a second isolation transistor and a second offset cancellation transistor, and the second dummy conductive line being disposed adjacent to the second PMOS transistor, wherein the second dummy conductive line, the second isolation transistor and the second offset cancellation transistor are disposed between the second PMOS transistor and the second NMOS transistor,
wherein the first set and second set are disposed symmetrically.

12. The method of claim 11, wherein the first and second isolation transistors are turned-on when the isolation signal is logic high and connect the bit line pair to the sensing bit line pair.

13. The method of claim 11, wherein the first offset compensation transistor is turned-on when the offset cancellation signal is logic high for connecting the bit line to the complementary sensing bit line, and the second offset compensation transistor is turned-on when the offset cancellation signal is logic high for connecting the complementary bit line to the sensing bit line.

14. The method of claim 13, wherein the offset canceling operation cancels offset voltage of the sense amplifier by forming a voltage difference on the bit line pairs and the sensing bit line pairs that cancels the offset voltage.

15. The method of claim 11, wherein the sense amplifier further comprising an equalizer connected between a pre-charge voltage line and one of the sensing bit line and the complementary sensing bit line for precharging the sensing bit line and the complementary sensing bit line.

16. The method of claim 15, wherein the equalizer is disposed between the first PMOS transistor and the first NMOS transistor.

17. The method of claim 11, wherein the isolation transistor and the offset compensation transistor share a common active pattern, and each has a corresponding gate pattern.

18. The method of claim 11, wherein the first control signal is connected to source nodes of the first and second PMOS transistors.

19. The method of claim 11, wherein the second control signal is connected to source nodes of the first and second NMOS transistors.

20. The method of claim 11, wherein the first precharge voltage is substantially half level of the internal supply voltage.

* * * * *